United States Patent
Yagishita

(10) Patent No.: US 12,401,373 B2
(45) Date of Patent: Aug. 26, 2025

(54) ANALOG-TO-DIGITAL CONVERTER AND ELECTRONIC APPARATUS

(71) Applicant: SONY SEMICONDUCTOR SOLUTIONS CORPORATION, Kanagawa (JP)

(72) Inventor: Yuki Yagishita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 97 days.

(21) Appl. No.: 18/258,276

(22) PCT Filed: Nov. 4, 2021

(86) PCT No.: PCT/JP2021/040499
§ 371 (c)(1),
(2) Date: Jun. 19, 2023

(87) PCT Pub. No.: WO2022/137821
PCT Pub. Date: Jun. 30, 2022

(65) Prior Publication Data
US 2024/0297661 A1    Sep. 5, 2024

(30) Foreign Application Priority Data
Dec. 24, 2020 (JP) ................. 2020-214432

(51) Int. Cl.
*H03M 1/12* (2006.01)
*H03M 1/46* (2006.01)

(52) U.S. Cl.
CPC ......... *H03M 1/462* (2013.01); *H03M 1/1245* (2013.01)

(58) Field of Classification Search
CPC ............ H03M 1/462; H03M 1/466
(Continued)

(56) References Cited

U.S. PATENT DOCUMENTS

| 7,741,981 B1* | 6/2010 | Wan ............ H03M 1/02 341/110 |
| 2008/0018514 A1* | 1/2008 | Ryu ............ H03M 1/06 341/172 |

(Continued)

FOREIGN PATENT DOCUMENTS

| JP | 2014110445 A | 6/2014 |
| JP | 2019-220780 A | 12/2019 |

OTHER PUBLICATIONS

International Search Report and Written Opinion of PCT Application No. PCT/JP2021/040499, issued on Dec. 21, 2021, 08 pages of ISRWO.

(Continued)

*Primary Examiner* — Peguy Jean Pierre
(74) *Attorney, Agent, or Firm* — CHIP LAW GROUP

(57) ABSTRACT

To reduce a circuit scale in a successive approximation register analog to digital converter (SARADC) provided with a circuit that cancels a ripple. A digital-to-analog converter generates at least one of a pair of analog signals according to a predetermined control signal. A comparator compares the pair of analog signals and outputs a comparison result. A logic circuit generates a control signal on the basis of the comparison result. A plurality of switches opens and closes a path between one of a source and a drain of each of a plurality of positive-side transistors having different sizes and a plurality of negative-side transistors having different sizes and an output terminal of the comparator on the basis of the control signal. A positive-side common capacitor has one end connected to a node of a predetermined positive-side reference voltage, and has the other end connected in common to each of the gates of the plurality of positive-side transistors. A negative-side capacitor has one end connected to a node of a negative-side reference voltage lower than the positive-side reference voltage, and has the (Continued)

other end connected in common to the gates of each of the plurality of negative-side transistors.

11 Claims, 20 Drawing Sheets

(58) Field of Classification Search
USPC .............................. 341/118, 120, 144, 172
See application file for complete search history.

(56) References Cited

U.S. PATENT DOCUMENTS

| | | | |
|---|---|---|---|
| 2010/0001892 A1* | 1/2010 | Aruga | H03M 1/1047 |
| | | | 341/172 |
| 2013/0057422 A1 | 3/2013 | Johansson et al. | |
| 2019/0131988 A1 | 5/2019 | Li | |
| 2023/0163778 A1* | 5/2023 | Cho | H03M 1/38 |
| | | | 341/161 |

OTHER PUBLICATIONS

Tang, et al., "A 10-bit 100-MS/s Sar Adc with Always-on Reference Ripple Cancellation", 2020 IEEE Symposium on VLSI Circuits, Aug. 2020.

* cited by examiner

*FIG. 7*

| Dac_p[m] | Dac_n[m] | CDAC | | RIPPLE CANCELLER | | |
|---|---|---|---|---|---|---|
| | | POSITIVE-SIDE CAPACITOR (m BIT) | NEGATIVE-SIDE CAPACITOR (m BIT) | POSITIVE-SIDE Tr (m BIT) | NEGATIVE-SIDE Tr (m BIT) | COMMON-SIDE Tr (m BIT) |
| 0 | 0 | VCOM | VCOM | - | - | POSITIVE-SIDE OUTPUT TERMINAL NEGATIVE-SIDE OUTPUT TERMINAL |
| 1 | 0 | VREFP | VREFN | NEGATIVE-SIDE OUTPUT TERMINAL | POSITIVE-SIDE OUTPUT TERMINAL | - |
| 0 | 1 | VREFN | VREFP | POSITIVE-SIDE OUTPUT TERMINAL | NEGATIVE-SIDE OUTPUT TERMINAL | - |

ANALOG-TO-DIGITAL CONVERTER AND ELECTRONIC APPARATUS

CROSS REFERENCE TO RELATED APPLICATIONS

This application is a U.S. National Phase of International Patent Application No. PCT/JP2021/040499 filed on Nov. 4, 2021, which claims priority benefit of Japanese Patent Application No. JP 2020-214432 filed in the Japan Patent Office on Dec. 24, 2020. Each of the above-referenced applications is hereby incorporated herein by reference in its entirety.

TECHNICAL FIELD

The present technology relates to an analog-to-digital converter. Specifically, the present technology relates to a successive approximation type analog-to-digital converter and an electronic apparatus.

BACKGROUND ART

A successive approximation register analog to digital converter (SARADC) has been widely used from the past in various electronic apparatuses because of its high resolution and low power consumption. Here, the SARADC is a circuit in which a comparator sequentially compares a sampled analog signal and a reference signal generated by a digital to analog converter (DAC) and a logic circuit controls the DAC to cause the signals to coincide with each other. In this SARADC, when a level of the reference signal is changed, a shake called a ripple sometimes occurs in the output signal of the DAC, and there is a risk that the ripple causes an error in a comparison result of the comparator. Therefore, an SARADC has been proposed in which a capacitor unit including four capacitors and a plurality of switches is arranged in every bit to generate a signal having an opposite phase to the ripple (see, for example, Patent Document 1).

CITATION LIST

Non-Patent Document

Non-Patent Document 1: Xiyuan Tang, et al., A 10-bit 100-MS/s SAR ADC with Always-on Reference Ripple Cancellation, IEEE Symposium on VLSI Circuits, 2020.

SUMMARY OF THE INVENTION

Problems to be Solved by the Invention

In the above-described conventional technique, the ripple is canceled by generating a signal having an opposite phase to the ripple. However, in the above-described SARADC, because it is necessary to provide four capacitors for every bit, there is a problem that the circuit scale increases as the resolution of the SARADC increases. For example, in a case where the resolution is 5 bits, a total of 20 capacitors need to be arranged in the five capacitor units.

The present technology has been made in view of such a situation, and an object of the present technology is to reduce a circuit scale in an SARADC provided with a circuit that cancels the ripple.

Solutions to Problems

The present technology has been made to solve the above-described problems, and a first aspect thereof is an analog-to-digital converter including: a digital-to-analog converter that generates at least one of a pair of analog signals according to a predetermined control signal; a comparator that compares the pair of analog signals and outputs a comparison result; a logic circuit that generates the control signal on the basis of the comparison result; a plurality of positive-side transistors having different sizes; a plurality of negative-side transistors having different sizes; a plurality of switches each opens and closes a path between one of a source and a drain of each of the plurality of positive-side transistors and the plurality of negative-side transistors and an output terminal of the comparator on the basis of the control signal; a positive-side common capacitor whose one end is connected to a node of a predetermined positive-side reference voltage and an other end is connected in common to each of gates of the plurality of positive-side transistors; and a negative-side common capacitor whose one end is connected to a node of a negative-side reference voltage lower than the positive-side reference voltage and an other end is connected in common to gates of each of the plurality of negative-side transistors. This brings about an effect of reducing a circuit scale.

Furthermore, in the first aspect, the pair of analog signals may be a differential signal, and the digital-to-analog converter may generate the differential signal. This brings about an effect of reducing the circuit scale of the analog-to-digital converter of differential input.

Furthermore, in the first aspect, there may be further included a sampling switch that opens and closes a path between the other end of each of the positive-side common capacitor and the negative-side common capacitor and a common voltage between the positive-side reference voltage and the negative-side reference voltage. This brings about an effect that the reference voltage is sampled in the positive-side common capacitor and the negative-side common capacitor.

Furthermore, in the first aspect, the sampling switch may shift to a closed state within a predetermined sampling period. This brings about an effect that the sampling is performed within the sampling period.

Furthermore, in the first aspect, the sampling switch may shift to a closed state within a period from the end of the analog-to-digital conversion to the start of the sampling. This brings about an effect that the sampling is performed within the period from the end of the analog-digital conversion to the start of the sampling.

Furthermore, in the first aspect, there may be further included a latch circuit that holds the comparison result and supplies the comparison result to the logic circuit. This brings about an effect of holding the comparison result.

Furthermore, in the first aspect, each of the plurality of positive-side transistors and the plurality of negative-side transistors may be an nMOS transistor. This brings about an effect that a current flows through a differential pair of the nMOS transistors.

Furthermore, in the first aspect, each of the plurality of positive-side transistors and the plurality of negative-side transistors may be a pMOS transistor. This brings about an effect that a current flows through a differential pair of the pMOS transistors.

Furthermore, in the first aspect, there may be further included a plurality of pairs of common-side transistors having different sizes, and the plurality of pairs of common-side transistors may have a gate connected to a node of a common voltage between the positive-side reference voltage and the negative-side reference voltage. This brings about an effect that the common voltage is applied to the gate of the common-side transistor.

Furthermore, in the first aspect, there may be further included a plurality of pairs of first common-side transistors having different sizes and a plurality of pairs of second common-side transistors having different sizes, in which the positive-side common capacitor may include a first positive-side common capacitor and a second positive-side common capacitor, the negative-side common capacitor may include a first negative-side common capacitor and a second negative-side common capacitor, the plurality of positive-side transistors may include a plurality of first positive-side transistors having different sizes and a plurality of second positive-side transistors having different sizes, the plurality of negative-side transistors may include a plurality of first negative-side transistors having different sizes and a plurality of second negative-side transistors having different sizes, the plurality of first positive-side transistors may each have a gate connected in common to the first positive-side common capacitor, the plurality of second positive-side transistors may each have a gate connected in common to the second positive-side common capacitor, the plurality of first negative-side transistors may each have a gate connected in common to the first negative-side common capacitor, and the plurality of second negative-side transistors may each have a gate connected in common to the second negative-side common capacitor. This brings about an effect that the common voltage is unnecessary.

Furthermore, a second aspect of the present technology is an electronic apparatus including: a digital-to-analog converter that generates at least one of a pair of analog signals according to a predetermined control signal; a comparator that compares the pair of analog signals and outputs a comparison result; a logic circuit that generates the control signal on the basis of the comparison result and also generates a digital signal; a plurality of positive-side transistors having different sizes; a plurality of negative-side transistors having different sizes; a plurality of switches each opens and closes a path between one of a source and a drain of each of the plurality of positive-side transistors and the plurality of negative-side transistors and an output terminal of the comparator on the basis of the control signal; a positive-side common capacitor whose one end is connected to a node of a predetermined positive-side reference voltage and an other end is connected in common to each of gates of the plurality of positive-side transistors; a negative-side common capacitor whose one end is connected to a node of a negative-side reference voltage lower than the positive-side reference voltage and an other end is connected in common to gates of each of the plurality of negative-side transistors; and a digital signal processing circuit that processes the digital signal. This brings about an effect that a circuit scale of the electronic apparatus is reduced.

BRIEF DESCRIPTION OF DRAWINGS

FIG. 7 is a diagram for explaining a connection state between the CDAC and the ripple canceller according to the first embodiment of the present technology.

MODE FOR CARRYING OUT THE INVENTION

Hereinafter, modes for carrying out the present technology (hereinafter, referred to as embodiments) are described. The description is given in the following order.

1. First embodiment (Example in which the number of capacitors is reduced)
2. Second embodiment (Example in which the number of capacitors are reduced and timing of sampling is changed)
3. Third embodiment (Example in which the number of capacitors are reduced and polarity of transistor is changed)

4. Fourth embodiment (Example in which the number of capacitors is reduced and common voltage is eliminated)
5. Application example to mobile body

1. First Embodiment

[Configuration Example of Electronic Apparatus]

Figure 1:
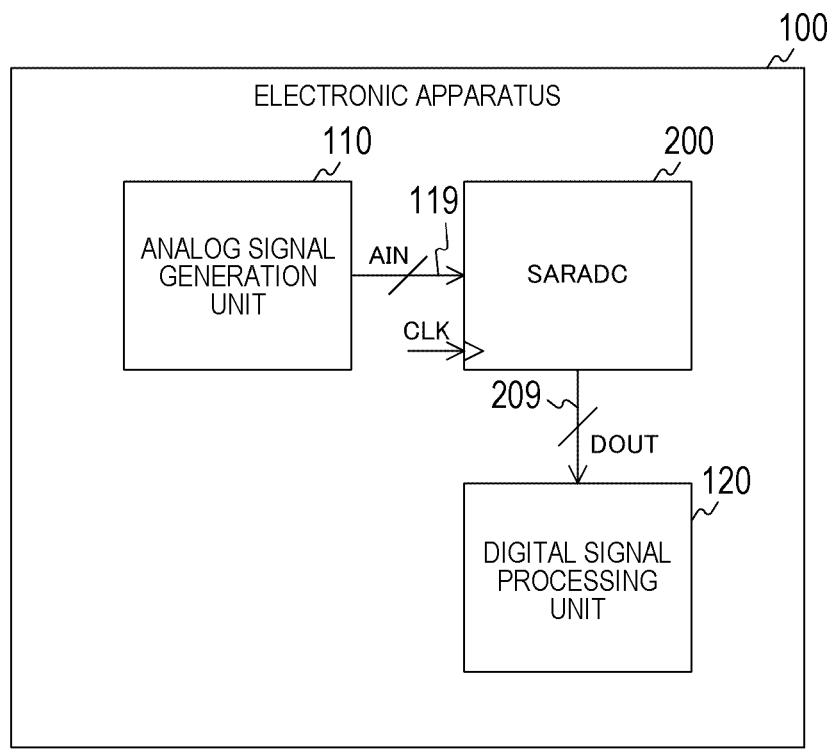
FIG. 1 is a block diagram showing a configuration example of an electronic apparatus according to a first embodiment of the present technology.

FIG. 1 is a block diagram showing a configuration example of an electronic apparatus 100 according to a first embodiment of the present technology. This electronic apparatus 100 converts an analog signal into a digital signal and processes the digital signal, and includes an analog signal generation unit 110, an SARADC 200, and a digital signal processing unit 120. As the electronic apparatus 100, an imaging device, an audio device, a communication device, or the like is assumed.

The analog signal generation unit 110 generates an analog signal AIN and supplies the same to the SARADC 200 via a signal line 119. As the analog signal AIN, a pixel signal, an audio signal, or a radio frequency (RF) signal is assumed.

The SARADC 200 converts the input analog signal AIN into a digital signal DOUT by a successive approximation method. This SARADC 200 supplies the digital signal DOUT to the digital signal processing unit 120 via a signal line 209.

The digital signal processing unit 120 executes predetermined signal processing on the digital signal DOUT. As the signal processing, image processing such as demosaic processing, audio compression processing, demodulation processing, and the like are assumed.

Note that the number of SARADCs 200 is not limited to one, and may be two or more. For example, in an imaging device, the SARADC 200 may be arranged in every column.

[Configuration Example of SARADC]

Figure 2:
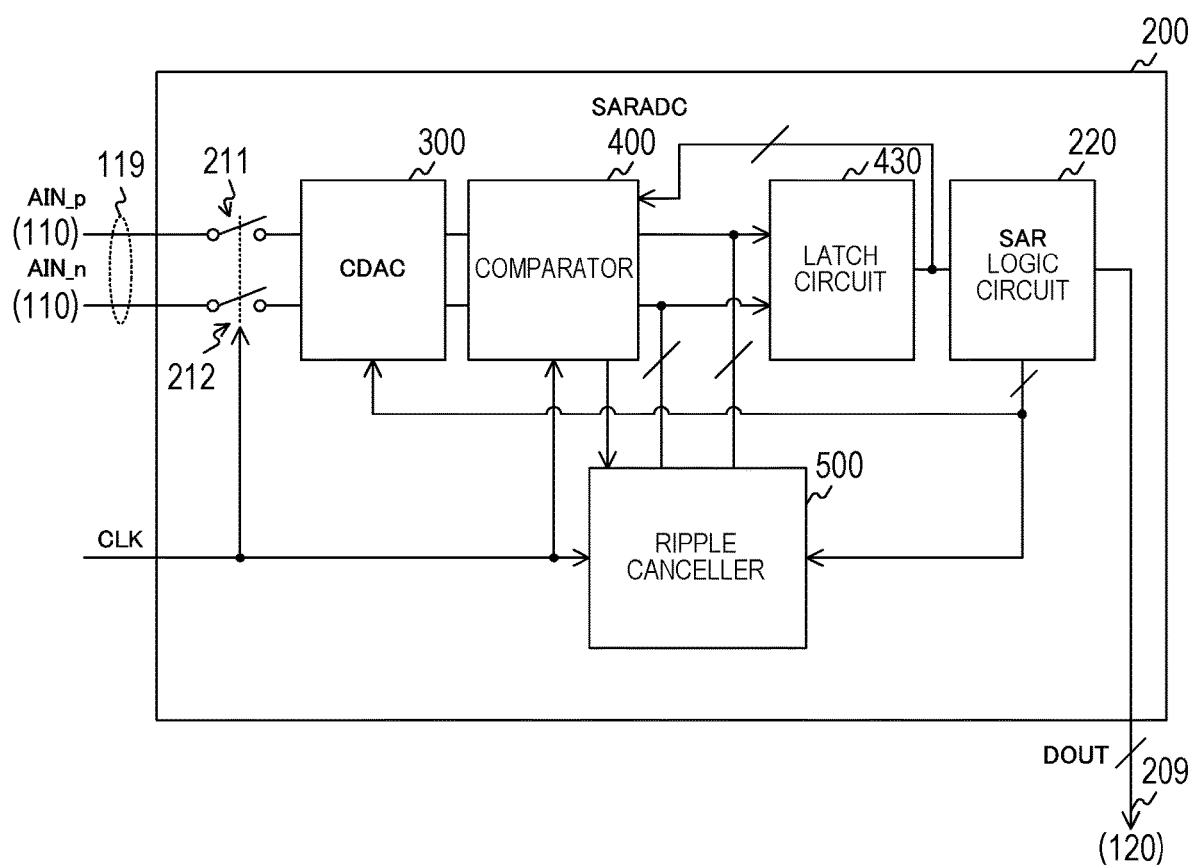
FIG. 2 is a block diagram showing a configuration example of an SARADC according to the first embodiment of the present technology.

FIG. 2 is a block diagram showing a configuration example of the SARADC 200 according to the first embodiment of the present technology. The SARADC 200 includes sampling switches 211 and 212, a capacitor DAC (CDAC) 300, a latch circuit 430, a comparator 400, and a successive approximation register (SAR) logic circuit 220. Furthermore, the SARADC 200 further includes a ripple canceller 500.

The differential analog signal from the analog signal generation unit 110 is input to the sampling switches 211 and 212. The differential signal (that is, the analog signal) includes a positive-side signal AIN_p and a negative-side signal AIN_n. The sampling switches 211 and 212 open and close the path between the analog signal generation unit 110 and the CDAC 300 in synchronization with a sampling clock CLK. For example, during a period in which the sampling clock CLK is at a high level, the sampling switches 211 and 212 turn to a closed state, and the differential signal is sampled.

The CDAC 300 generates an analog reference signal by digital-to-analog (DA) conversion. This CDAC 300 holds the sampled differential signal (analog signal) and differentially outputs a difference between the analog signal and the internally generated reference signal (analog signal) to the comparator 400.

The comparator 400 compares the positive side and the negative side of the differential signal from the CDAC 300. This comparator 400 supplies a comparison result to the latch circuit 430. The latch circuit 430 holds the comparison result. This latch circuit 430 supplies the held comparison result to the SAR logic circuit 220.

The SAR logic circuit 220 controls the level of the reference signal on the basis of the comparison result of the comparator 400. This SAR logic circuit 220 updates the level of the reference signal so that the positive side and the negative side of the output of the CDAC 300 are balanced by a successive approximation method. Assuming that the resolution of the SARADC 200 is M (M is an integer) bits, the number of successive comparisons is M. In addition, the SAR logic circuit 220 holds each of the M times of comparison results, and supplies a bit string in which bits indicating the comparison results are aligned to the digital signal processing unit 120 as the digital signal DOUT.

The ripple canceller 500 cancels the ripple of the output signal of the CDAC 300. The circuit configuration of the ripple canceller 500 is described later.

[Configuration Example of CDAC]

Figure 3:
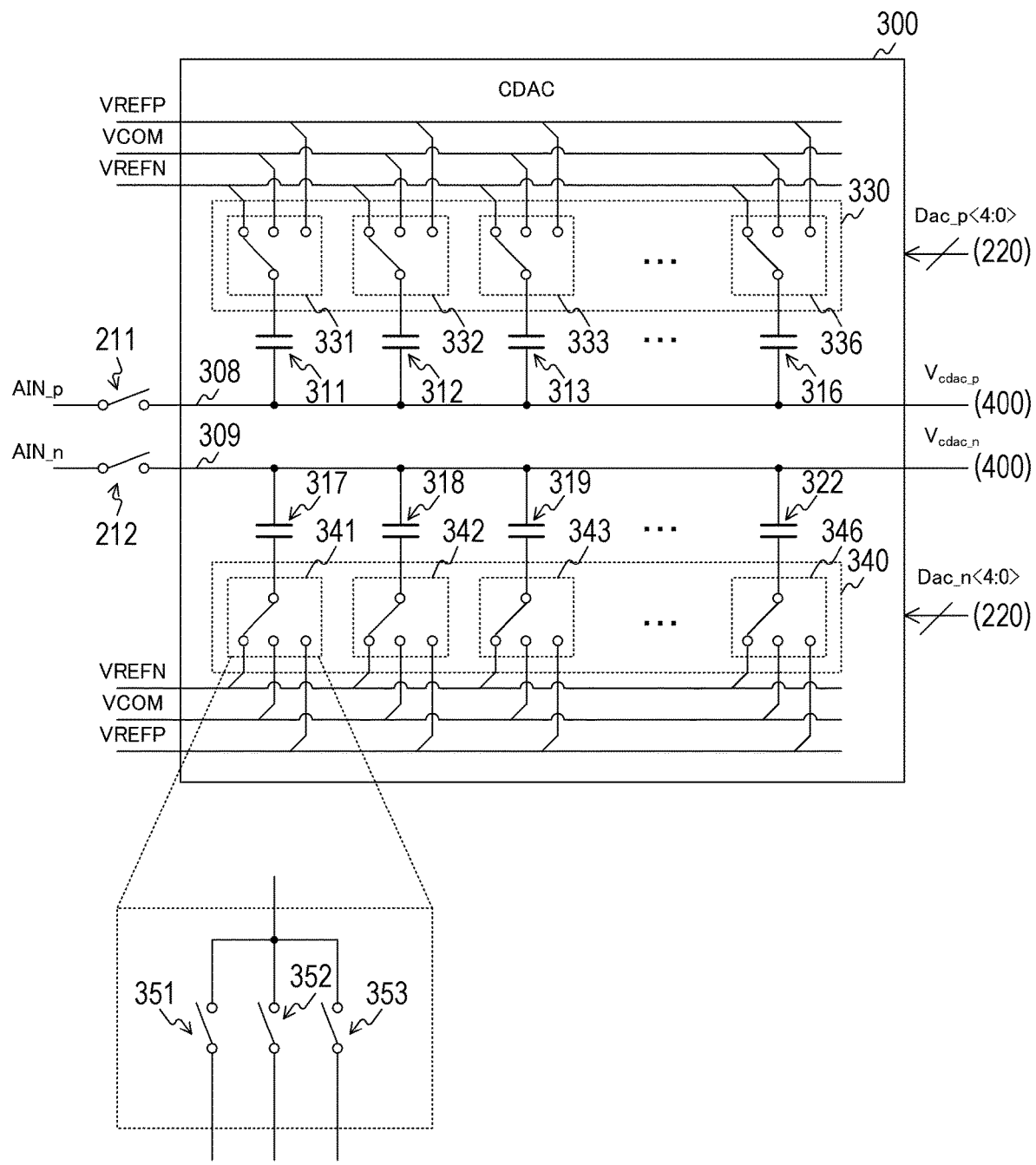
FIG. 3 is a circuit diagram showing a configuration example of a CDAC according to the first embodiment of the present technology.

FIG. 3 is a circuit diagram showing a configuration example of the CDAC 300 according to the first embodiment of the present technology. This drawing exemplifies a circuit in a case where the resolution is 5 bits. This CDAC 300 includes positive-side capacitors 311 to 316, negative-side capacitors 317 to 322, a positive-side switching unit 330, and a negative-side switching unit 340. Positive-side switching circuits 331 to 336 are arranged in the positive-side switching unit 330, and negative-side switching circuits 341 to 346 are arranged in the negative-side switching unit 340. Note that, in this drawing, the positive-side capacitors 314 and 315, the negative-side capacitors 320 and 321, the positive-side switching circuits 334 and 335, and the negative-side switching circuits 344 and 345 are omitted.

In addition, a positive-side signal line 308 and a negative-side signal line 309 are wired in the CDAC 300. The positive-side signal line 308 is wired between a positive-side input terminal and a positive-side output terminal of the CDAC 300. The negative-side signal line 309 is wired between a negative-side input terminal and a negative-side output terminal of the CDAC 300. The voltage of the positive-side signal line 308 is output to the comparator 400 as a positive-side voltage $V_{cdac\_p}$. The voltage of the negative-side signal line 309 is output to the comparator 400 as a negative-side voltage $V_{cdac\_n}$.

One ends of the positive-side capacitors 311 to 316 are commonly connected to the positive-side signal line 308. The other ends of these positive-side capacitors 311 to 316 are connected to the positive-side switching circuits 331 to 336. Furthermore, the capacitances of the positive-side capacitors 311 to 315 are different from each other. For example, assuming that a predetermined unit capacitance value is C, the capacitance values of the positive-side capacitors 311, 312, 313, 314, 315, and 316 are set to 16 C, 8 C, 4 C, 2 C, C, and C.

One ends of the negative-side capacitors 317 to 322 are commonly connected to the negative-side signal line 309. The other ends of these negative-side capacitors 317 to 322 are connected to the negative-side switching circuits 341 to 346. Furthermore, the capacitances of the negative-side capacitors 317 to 321 are different from each other. For example, the capacitance values of the negative-side capacitors 317, 318, 319, 320, 321, and 322 are set to 16 C, 8 C, 4 C, 2 C, C, and C.

The capacitor of 16 C and the corresponding switching circuit correspond to a most significant bit (MSB) among 5 bits. The capacitor of 8C and the corresponding switching circuit correspond to the second bit, and the capacitor of 4C and the corresponding switching circuit correspond to the third bit. The capacitor of 2C and the corresponding switching circuit correspond to the fourth bit, and one of the capacitor of C and the corresponding switching circuit correspond to a least significant bit (LSB). The other of the capacitor of C is used as a dummy capacitor.

The positive-side switching circuits 331 to 335 connect the other end of the corresponding positive-side capacitor to any one of a positive-side reference voltage VREFP, a common voltage VCOM, and a negative-side reference voltage VREFN according to control signals Dac_p and Dac_n from the SAR logic circuit 220. The size of each of the control signals Dac_p and Dac_n is 5 bits. The positive-side switching circuit 336 connects the other end of the dummy positive-side capacitor 316 to any one of the positive-side reference voltage VREFP, the common voltage VCOM, and the negative-side reference voltage VREFN according to a control signal (not illustrated) from the SAR logic circuit 220.

The positive-side reference voltage VREFP is a constant voltage higher than the common voltage VCOM, and the negative-side reference voltage VREFN is a constant voltage lower than the common voltage VCOM. The positive-side reference voltage VREFP can also be expressed as +VREF, and the value of the negative-side reference voltage VREFN can also be expressed as −VREF.

The negative-side switching circuits 341 to 345 connect the other end of the corresponding negative-side capacitor to any one of the positive-side reference voltage VREFP, the common voltage VCOM, and the negative-side reference voltage VREFN according to control signals Dac_p and Dac_n from the SAR logic circuit 220. The negative-side switching circuit 346 connects the other end of the dummy positive-side capacitor 316 to any one of the positive-side reference voltage VREFP, the common voltage VCOM, and the negative-side reference voltage VREFN according to a control signal (not illustrated) from the SAR logic circuit 220.

Furthermore, the negative-side switching circuit 341 includes, for example, switches 351 to 353. The similar applies to the positive-side switching circuits 331 to 336 and other negative-side switching circuits.

The SAR logic circuit 220 connects all of the positive-side capacitors 311 to 316 and the negative-side capacitors 317 to 322 to the common voltage VCOM by a control signal within a period (that is, a sampling period) in which the sampling switches 211 and 212 are in the closed state. With this arrangement, the sampled differential signal is held.

Then, the SAR logic circuit 220 refers to the comparison result of the comparator 400, and controls the connection destination of the capacitor in the CDAC 300 by the control signal on the basis of the comparison result.

For example, in a case where the positive side is equal to or more than the negative side in the first comparison result, the SAR logic circuit 220 connects the negative-side reference voltage VREFN to the positive-side capacitor 311 and connects the positive-side reference voltage VREFP to the negative-side capacitor 317. On the other hand, in a case where the positive side is less than the negative side in the first comparison result, the SAR logic circuit 220 connects the positive-side reference voltage VREFP to the positive-side capacitor 311 and connects the negative-side reference voltage VREFN to the negative-side capacitor 317. By these controls, −½ VREF or +½ VREF is added to the positive side and +½ VREF or −½ VREF is added to the negative side.

Furthermore, in a case where the positive side is equal to or more than the negative side in the second comparison result, the SAR logic circuit 220 connects the negative-side reference voltage VREFN to the positive-side capacitor 312 and connects the positive-side reference voltage VREFP to the negative-side capacitor 318. On the other hand, in a case where the positive side is less than the negative side in the second comparison result, the SAR logic circuit 220 connects the positive-side reference voltage VREFP to the positive-side capacitor 312 and connects the negative-side reference voltage VREFN to the negative-side capacitor 318. By these controls, −¼ VREF or +¼ VREF is added to the positive side and +¼ VREF or −¼ VREF is added to the negative side.

Hereinafter, the SAR logic circuit 220 repeats the similar control until the number of comparisons reaches five times. Note that, in a case where the resolution (M bits) is other than 5 bits, positive-side capacitors, negative-side capacitors, positive-side switching circuits, and negative-side switching circuits, each of which includes M+1 pieces including a dummy, are respectively aligned. The capacitance of the m-th bit (m is an integer from 0 to M−1) is set to twice the capacitance of the m+1-th bit.

As described above, the method of controlling the reference voltage on the basis of the results of M times of successive comparisons is referred to as a successive approximation method.

Note that, instead of the differential signal, a single-ended signal can be input to the SARADC 200. In this case, a capacitor or a switch is unnecessary on one of the positive side and the negative side in the CDAC 300. Furthermore, the single-ended signal sampled and held is input to one of the input terminals of the comparator 400, and the reference voltage generated by the CDAC 300 is input to the other of the input terminals.

[Control Example of Comparator]

Figure 4:
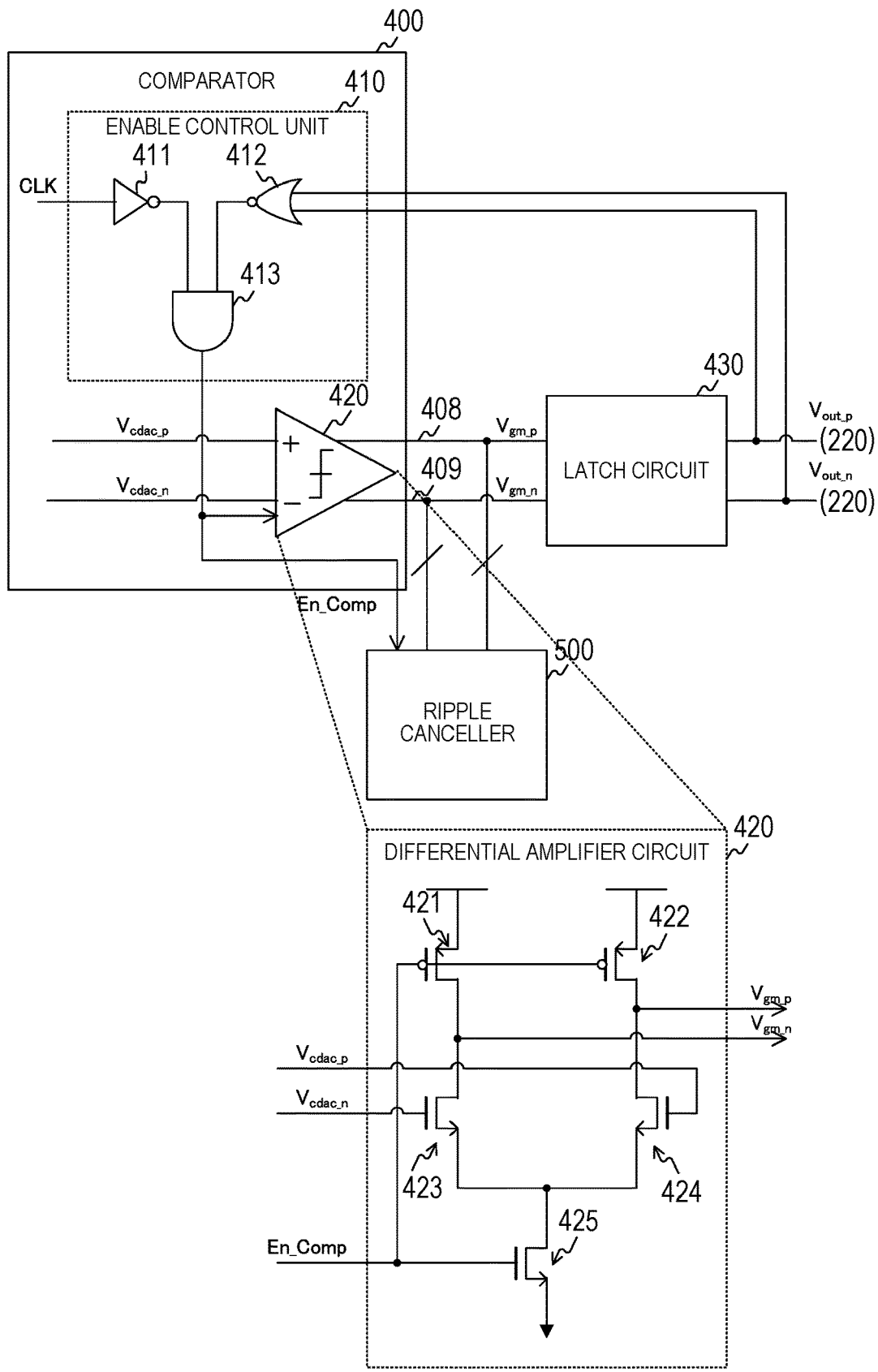
FIG. 4 is a circuit diagram showing a configuration example of a comparator according to the first embodiment of the present technology.

FIG. 4 is a circuit diagram showing a configuration example of the comparator 400 in the first embodiment of the present technology. The comparator 400 includes an enable control unit 410 and a differential amplifier circuit 420.

The enable control unit 410 generates an enable signal En_Comp from the output of the latch circuit 430 and the sampling clock CLK. This enable control unit 410 includes an inverter 411, a negative logical sum (NOR) gate 412, and a logical product (AND) gate 413.

The inverter 411 inverts the sampling clock CLK and supplies the inverted clock to the AND gate 413.

The NOR gate 412 supplies a negative logical sum of a positive-side voltage $V_{out\_p}$ and a negative-side voltage $V_{out\_n}$ of the latch circuit 430 to the AND gate 413.

The AND gate 413 supplies a logical product of the signal from the inverter 411 and the signal from the NOR gate 412 to the differential amplifier circuit 420 and the ripple canceller 500 as the enable signal En_Comp.

The positive-side voltage $V_{cdac\_p}$ and the negative-side voltage $V_{cdac\_n}$ from the CDAC 300 are input to the differential amplifier circuit 420. The differential amplifier circuit 420 compares the voltages. The comparison result is differentially output to the SAR logic circuit 220 and the latch circuit 430 via a positive-side signal line 408 and a negative-side signal line 409. The differential amplifier circuit 420 includes p-channel metal oxide semiconductor (pMOS) transistors 421 and 422, and n-channel MOS (nMOS) transistors 423 to 425.

The pMOS transistor 421 and the nMOS transistor 423 are connected in series between the power supply node and the drain of the nMOS transistor 425. The pMOS transistor 422 and the nMOS transistor 423 are connected in series between the power supply node and the drain of the nMOS transistor 425. The source of the nMOS transistor 425 is connected to the ground node.

Furthermore, the enable signal En_Comp is input to each of the gates of the pMOS transistors 421 and 422 and the nMOS transistor 425. The negative-side voltage $V_{cdac\_n}$ is input to the gate of the nMOS transistor 423, and the positive-side voltage $V_{cdac\_p}$ is input to the gate of the nMOS transistor 424.

Furthermore, a voltage at a connection node between the pMOS transistor 421 and the nMOS transistor 423 is output as a negative-side voltage $V_{gm\_n}$. A voltage at a connection node between the pMOS transistor 422 and the nMOS transistor 424 is output as a positive-side voltage $V_{gm\_p}$.

[Configuration Example of Latch Circuit]

Figure 5:
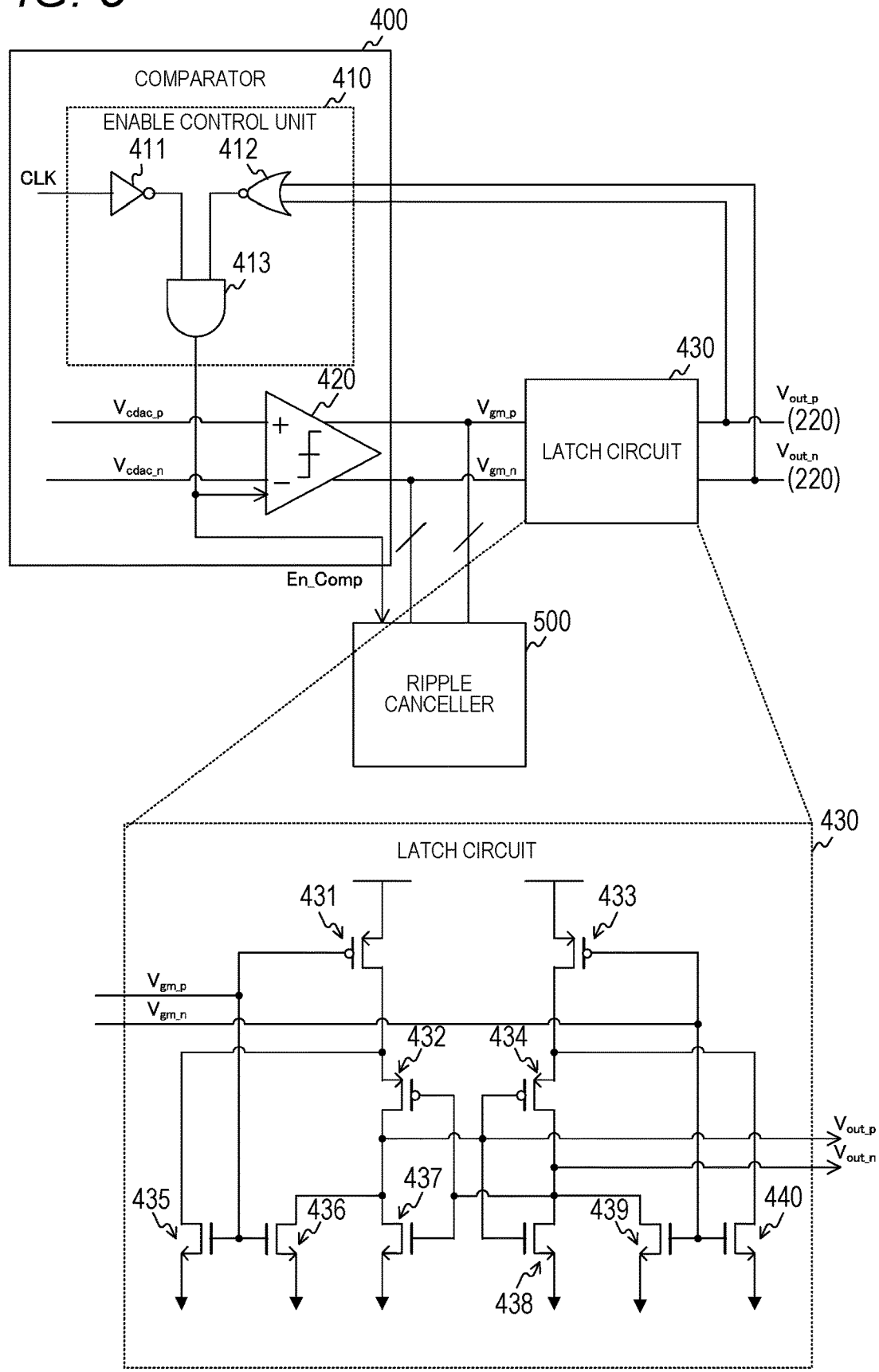
FIG. 5 is a circuit diagram showing a configuration example of a latch circuit according to the first embodiment of the present technology.

FIG. 5 is a circuit diagram showing a configuration example of the latch circuit 430 according to the first embodiment of the present technology. This latch circuit 430 includes pMOS transistors 431 to 434 and nMOS transistors 435 to 440.

The differential amplifier circuit 420 outputs a positive-side voltage $V_{gm\_p}$ of the differential signal from a positive-side output terminal to the latch circuit 430, and outputs a negative-side voltage $V_{gm\_n}$ of the differential signal from a negative-side output terminal to the latch circuit 430.

In the latch circuit 430, the pMOS transistors 431 and 432 are connected in series to the node of the power supply voltage. The nMOS transistors 436 and 437 are connected in parallel between the drain of the pMOS transistor 432 on the ground side and the node of the ground voltage. The nMOS transistor 435 is inserted between a connection node between the pMOS transistors 431 and 432 and the node of the ground voltage.

Furthermore, the pMOS transistors 433 and 434 are connected in series to the node of the power supply voltage. The nMOS transistors 438 and 439 are connected in parallel between the drain of the pMOS transistor 434 on the ground side and the node of the ground voltage. The nMOS transistor 440 is inserted between a connection node between the pMOS transistors 433 and 434 and the node of the ground voltage.

Furthermore, the positive-side voltage Vgm_p from the differential amplifier circuit 420 is input to each of the gates of the pMOS transistor 431 and the nMOS transistors 435 and 436. The negative-side voltage Vgm_n from the differential amplifier circuit 420 is input to each of the gates of the pMOS transistor 433 and the nMOS transistors 439 and 440.

Furthermore, a connection node between the pMOS transistor 432 and the nMOS transistor 437 is connected to each of the gates of the pMOS transistor 434 and the nMOS transistor 438. The voltage of this connection node is output as a positive-side voltage $V_{out\_p}$ to the SAR logic circuit 220 and the comparator 400.

Furthermore, a connection node between the pMOS transistor 434 and the nMOS transistor 438 is connected to each of the gates of the pMOS transistor 432 and the nMOS transistor 437. The voltage of this connection node is output as a negative-side voltage $V_{out\_n}$ to the SAR logic circuit 220 and the comparator 400.

With the connection configuration exemplified in the drawing, in a case where one of the positive-side voltage $V_{gm\_p}$ and the negative-side voltage $V_{gm\_n}$ is at the high level and the other is at the low level, the latch circuit 430 shifts to a through state. At this time, the positive-side voltage $V_{gm\_p}$ and the negative-side voltage $V_{gm\_n}$ are directly output as the positive-side voltage $V_{out\_p}$ and the negative-side voltage $V_{out\_n}$.

Furthermore, in a case where the positive-side voltage Vgm_p and the negative-side voltage Vgm_n are balanced, the latch circuit 430 shifts to a hold state, and the immediately preceding state is held.

Furthermore, the differential amplifier circuit 420 starts the comparison operation when the enable signal En_Comp changes from the low level to the high level. At the start of the operation, $V_{gm\_p}$ and $V_{gm\_n}$ are discharged from the power supply voltage to the ground voltage. The discharge speeds of $V_{gm\_p}$ and $V_{gm\_n}$ change depending on the magnitude of the difference between $V_{cdac\_p}$ and $V_{cdac\_n}$, and the output logic of the latch circuit 430 is determined by the difference in the discharge speeds.

[Configuration Example of Ripple Canceller]

Figure 6:
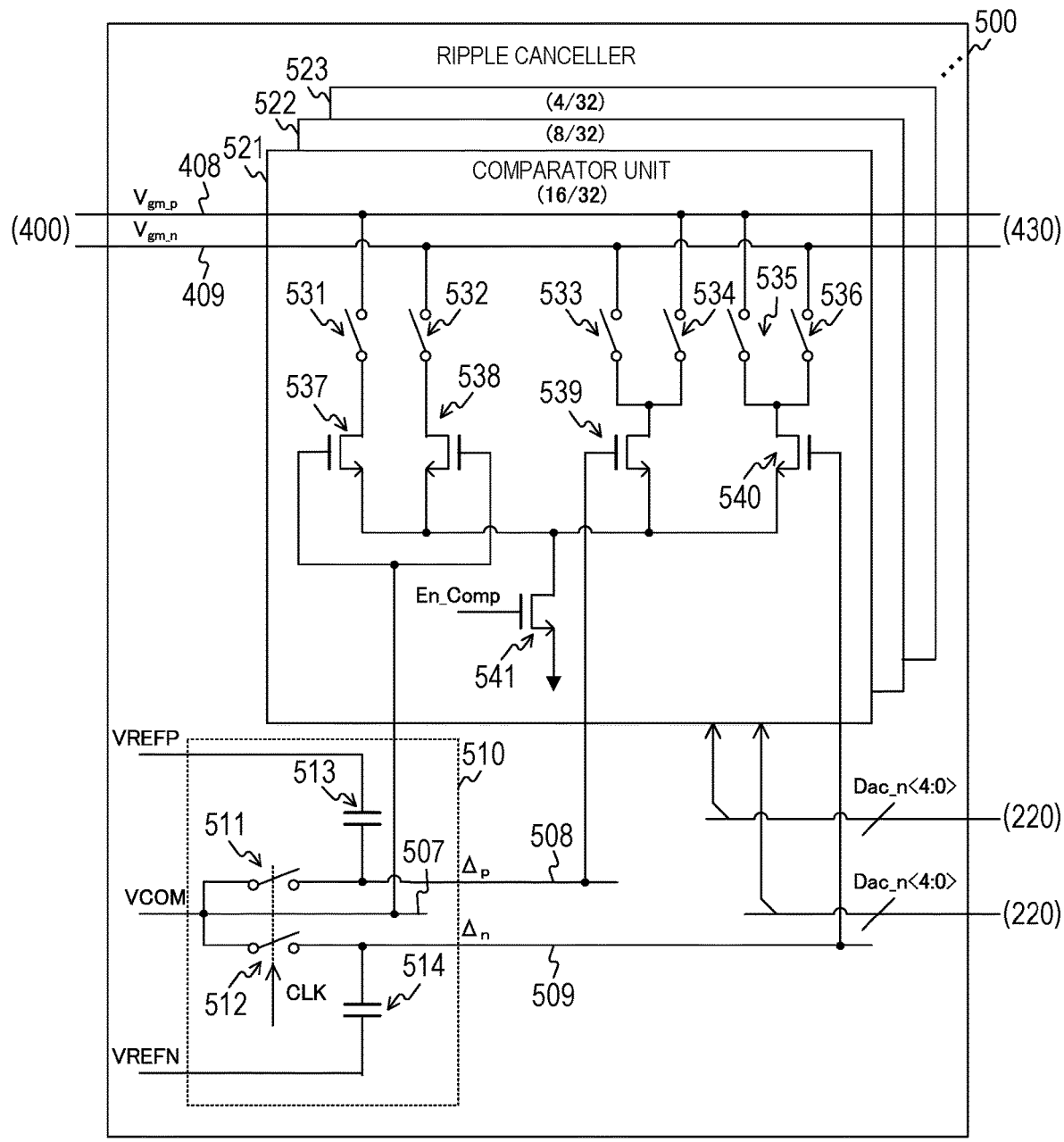
FIG. 6 is a circuit diagram showing a configuration example of a ripple canceller according to the first embodiment of the present technology.

FIG. 6 is a circuit diagram showing a configuration example of the ripple canceller 500 according to the first embodiment of the present technology. This drawing exemplifies a circuit in a case where the resolution is 5 bits. This ripple canceller 500 includes a capacitor unit 510 and comparator units 521 to 525. In the capacitor unit 510, sampling switches 511 and 512, a positive-side common capacitor 513, and a negative-side common capacitor 514 are arranged. Note that comparator units 524 and 525 are omitted in the drawing.

The sampling switch 511 opens and closes a path between a common signal line 507 of the common voltage VCOM and a positive-side signal line 508 according to the sampling clock CLK. The sampling switch 512 opens and closes a path between the common signal line 507 and a negative-side signal line 509 according to the sampling clock CLK. For example, during a period in which the sampling clock CLK is at the high level, the sampling switches 511 and 512 turn to a closed state.

One end of the positive-side common capacitor 513 is connected to a node of the positive-side reference voltage VREFP, and the other end is connected to the positive-side signal line 508. One end of the negative-side common capacitor 514 is connected to a node of the negative-side reference voltage VREFN, and the other end is connected to the negative-side signal line 509. When the charges stored in these capacitors are stabilized, the sampling switches 511 and 512 shift to an open state.

Here, it is desirable that the positive-side reference voltage VREFP and the negative-side reference voltage VREFN are in a stable state without ripples.

The comparator unit 521 includes switches 531 to 536, common-side transistors 537 and 538, a positive-side transistor 539, a negative-side transistor 540, and a switch transistor 541. As these transistors, nMOS transistors are used.

The switch 531 opens and closes a path between the drain of the common-side transistor 537 and the positive-side signal line 408 according to a control signal from the SAR logic circuit 220. As described above, this positive-side signal line 408 is connected to the positive-side output terminal of the comparator 400.

The switch 532 opens and closes a path between the drain of the common-side transistor 538 and the negative-side signal line 409 according to the control signal from the SAR logic circuit 220. As described above, this negative-side signal line 409 is connected to the negative-side output terminal of the comparator 400.

The switch 533 opens and closes a path between the drain of the positive-side transistor 539 and the negative-side signal line 409 according to the control signal from the SAR logic circuit 220. The switch 534 opens and closes a path between the drain of the positive-side transistor 539 and the positive-side signal line 408 according to the control signal from the SAR logic circuit 220.

The switch 535 opens and closes a path between the drain of the negative-side transistor 540 and the positive-side signal line 408 according to the control signal from the SAR logic circuit 220. The switch 536 opens and closes a path between the drain of the negative-side transistor 540 and the negative-side signal line 409 according to the control signal from the SAR logic circuit 220.

The sources of the common-side transistors 537 and 538 are commonly connected to the drain of the switch transistor 541, and the gates thereof are commonly connected to the common signal line 507 of the common voltage VCOM.

The source of the positive-side transistor 539 is connected to the drain of the switch transistor 541, and the gate of the positive-side transistor 539 is connected to the positive-side common capacitor 513 via the positive-side signal line 508. The source of the negative-side transistor 540 is connected to the drain of the switch transistor 541, and the gate of the negative-side transistor 540 is connected to the negative-side common capacitor 514 via the negative-side signal line 509.

The source of the switch transistor 541 is connected to the node of the ground voltage, and the enable signal En_Comp is input to the gate of the switch transistor 541.

The circuit configuration of each of the comparator units 522 to 525 is similar to that of the comparator unit 521. However, the sizes of the transistors of the comparator units are different from each other. Here, the "size" of the transistor indicates the size (gate width or gate length) of the gate of the transistor. For example, in a case where the gate width is set constant, the gate length is used as the size.

In a case where the size of the transistor in the comparator unit 525 is "1", the sizes of the transistors of the comparator units 521, 522, 523, and 524 are respectively set to "16", "8", "4", and "2".

The comparator unit 521 having a size of "16" corresponds to the MSB. The comparator unit 522 corresponds to the second bit, and the comparator unit 523 corresponds to the third bit. The comparator unit 524 corresponds to the fourth bit, and the comparator unit 525 having the size of "1" corresponds to the LSB.

Immediately after the sampling, only the switches 531 and 532 on the common side of all the bits are controlled to be in the closed state, and the switches 533 to 536 on the positive and negative sides of the corresponding bits are opened and closed according to the comparison result. Detailed control contents are described later.

Note that, in a case where the resolution (M bits) is other than 5 bits, M pieces of comparator units are aligned. The size of the transistor of the m-th bit is twice the size of the (m+1)-th bit. In addition, a bit depth of the resolution and the number of comparator units are made to coincide with each other, but the present invention is not limited to this configuration. The number of comparator units may be slightly smaller than the bit depth of the resolution. However, there is a possibility that an effect of canceling the ripple described later is reduced.

FIG. 7 is a diagram for explaining a connection state between the CDAC 300 and the ripple canceller 500 according to the first embodiment of the present technology. The m-th bit of the M-bit control signal Dac_p is set as Dac_p [m]. Similarly, the m-th bit of the M-bit control signal Dac_n is set as Dac_n [m]. An initial value of each bit of the control signals Dac_p and Dac_n is, for example, a logical value "0".

The SAR logic circuit 220 refers to the m-th comparison result of the comparator 400, and updates Dac_n [m] to the logical value "1" in a case where the positive side is equal to or more than the negative side. At this time, Dac_p [m] remains "0". On the other hand, in a case where the positive side is less than the negative side, the SAR logic circuit 220 updates Dac_p [m] to "1". At this time, Dac_n [m] remains "0".

In the CDAC 300, in a case where both Dac_p [m] and Dac_n [m] are "0", the positive-side capacitor and the negative-side capacitor of the m-th bit are connected to the common voltage VCOM.

Furthermore, in a case where Dac_p [m] is "1" and Dac_n [m] is "0", the positive-side capacitor of the m-th bit is connected to the positive-side reference voltage VREFP, and the negative-side capacitor of the m-th bit is connected to the negative-side reference voltage VREFN.

Furthermore, in a case where Dac_p [m] is "0" and Dac_n [m] is "1", the positive-side capacitor of the m-th bit is connected to the negative-side reference voltage VREFN, and the negative-side capacitor of the m-th bit is connected to the positive-side reference voltage VREFP.

Next, in the ripple canceller 500, in a case where both Dac_p [m] and Dac_n [m] are "0", the switches 531 and 532 of the m-th bit shift to the closed state. With this arrangement, the drains of the common-side transistors 537 and 538 of the m-th bit are respectively connected to the positive-side output terminal and the negative-side output terminal of the comparator 400. At this time, all the other switches other than the switches 531 and 532 shift to the open state.

In addition, in a case where Dac_p [m] is "1" and Dac_n [m] is "0", the switches 533 and 535 of the m-th bit shift to the closed state. With this arrangement, the drain of the positive-side transistor 539 is connected to the negative-side output terminal of the comparator 400, and the drain of the negative-side transistor 540 is connected to the positive-side output terminal of the comparator 400. At this time, all the other switches other than the switches 533 and 535 shift to the open state.

In addition, in a case where Dac_p [m] is "0" and Dac_n [m] is "1", the switches 534 and 536 of the m-th bit shift to the closed state. With this arrangement, the drain of the positive-side transistor 539 is connected to the positive-side output terminal of the comparator 400, and the drain of the negative-side transistor 540 is connected to the negative-side output terminal of the comparator 400. At this time, all the other switches other than the switches 534 and 536 shift to the open state.

Figure 8:
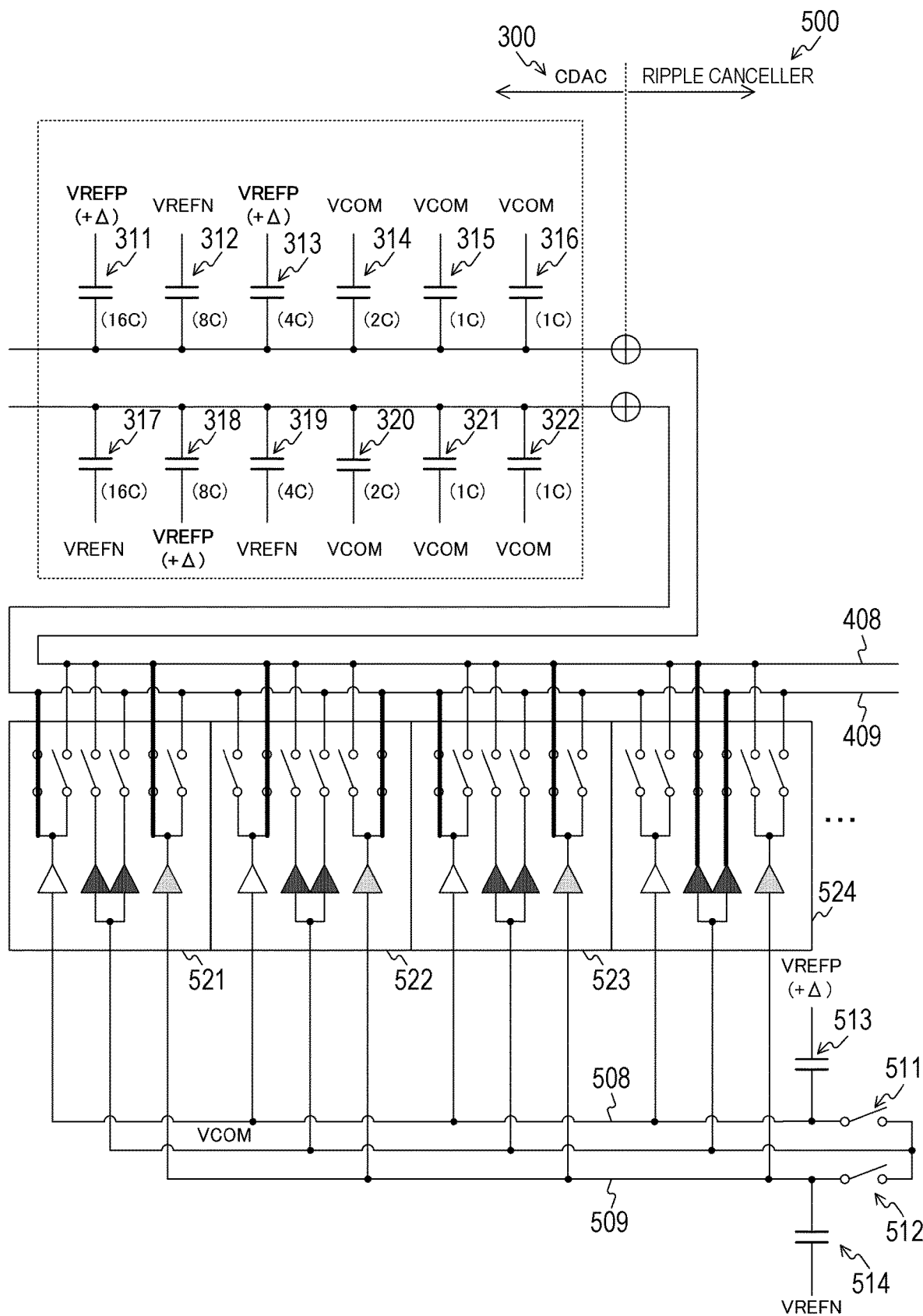
FIG. 8 is a diagram for explaining an example of control of a switch of the ripple canceller according to the first embodiment of the present technology.

FIG. 8 is a diagram for explaining an example of control of the switch of the ripple canceller according to the first embodiment of the present technology. In the drawing, a state is assumed in which control of up to the third bit has ended. In addition, in the drawing, the comparator 400 is omitted.

On the basis of the first comparison result, the SAR logic circuit 220 connects the positive-side capacitor 311 of 16 C to the positive-side reference voltage VREFP and the negative-side capacitor 317 of 16 C to the negative-side reference voltage VREFN by the control signal.

On the basis of the second comparison result, the SAR logic circuit 220 connects the positive-side capacitor 312 of 8 C to the negative-side reference voltage VREFN and the negative-side capacitor 318 of 8 C to the positive-side reference voltage VREFP by the control signal.

On the basis of the third comparison result, the SAR logic circuit 220 connects the positive-side capacitor 313 of 4 C to the positive-side reference voltage VREFP and the negative-side capacitor 319 of 4 C to the negative-side reference voltage VREFN by the control signal.

Here, assuming that a ripple component of 4 is generated in the positive-side reference voltage VREFP, a ripple component Vdac generated in the differential output of the CDAC 300 is expressed by the following equation.

$$V_{dac} = \{(16 - 8 + 4)C/32C\} \cdot \Delta \qquad \text{Equation 1}$$

On the other hand, the positive-side transistor of the comparator unit 521 of the first bit is connected to the negative-side output terminal of the comparator 400 via the negative-side signal line 409, and the negative-side transistor thereof is connected to the positive-side output terminal of the comparator 400 via the positive-side signal line 408. In the drawing, white triangles indicate the positive-side transistors, and black triangles indicate the common-side transistors. Gray triangles indicate negative-side transistors.

Furthermore, the positive-side transistor of the comparator unit 522 of the second bit is connected to the positive-side output terminal, and the negative-side transistor thereof is connected to the negative-side output terminal. The positive-side transistor of the comparator unit 523 of the third bit is connected to the negative-side output terminal, and the negative-side transistor thereof is connected to the positive-side output terminal.

With the above-described connection, a ripple component $V_{cancel}$ generated in the ripple canceller 500 is expressed by the following equation.

$$V_{cancel} = \\ -(16C/32)\Delta' + (8C/32)\Delta' - (4C/32)\Delta' = -\{(16 - 8 + 4)/32\} \cdot \Delta' \qquad \text{Equation 2}$$

The value of $\Delta'$ depends on the size of the smallest transistor in the ripple canceller 500. The size of the smallest transistor is adjusted to a value at which A in Equation 1 and $\Delta'$ in Equation 2 substantially coincide with each other.

In a case where $\Delta$ and $\Delta'$ substantially coincide with each other, from Equations 1 and 2, the absolute values of the ripple component of the CDAC 300 and the ripple component generated in the ripple canceller 500 are equivalent to each other, and the signs thereof are opposite to each other. Therefore, when the ripple components are added at the output terminal of the comparator 400, the ripple component of the CDAC 300 is canceled. By canceling the ripple component, an error in the comparison result of the comparator 400 can be reduced.

Figure 9:
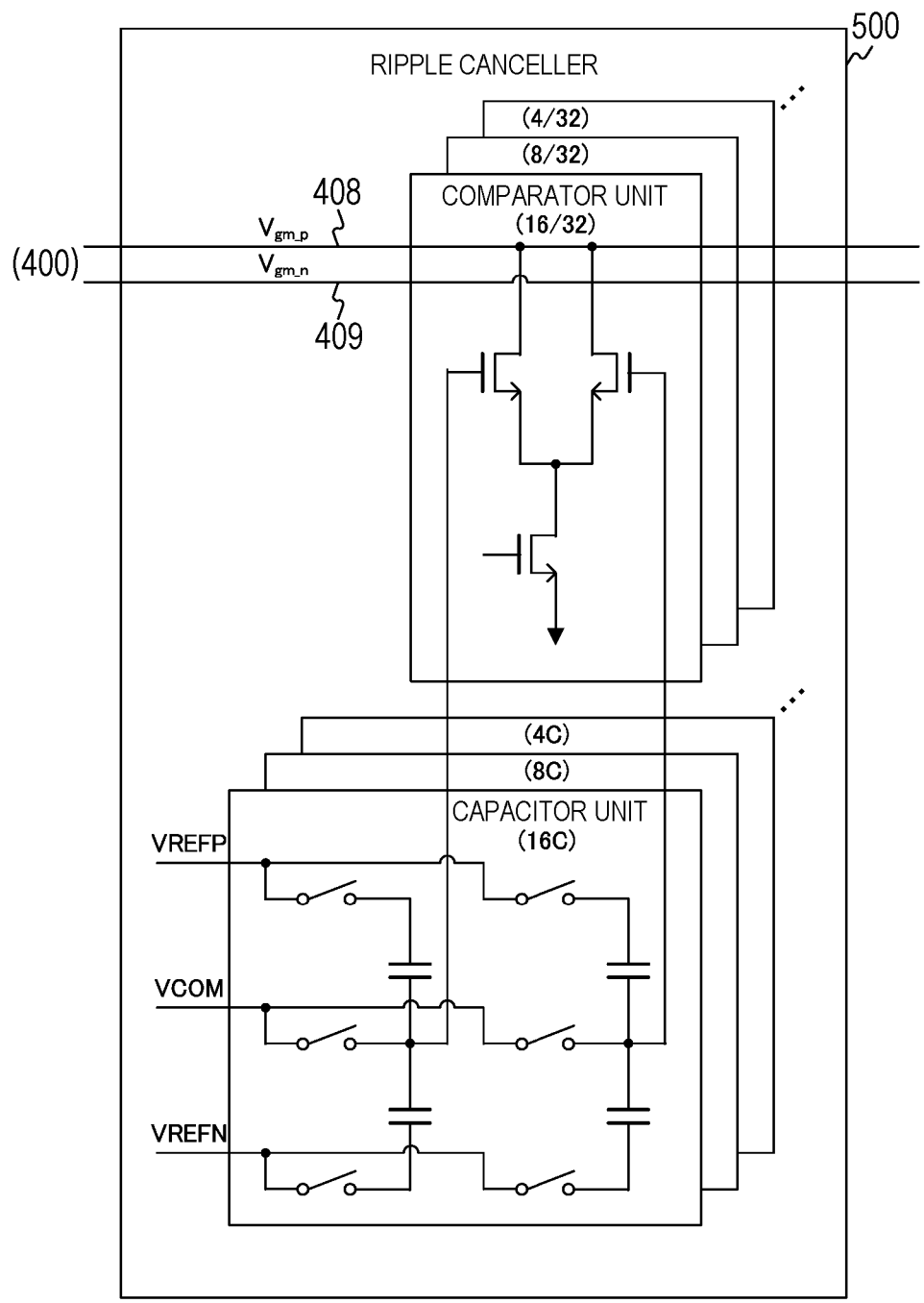
FIG. 9 is a circuit diagram showing a configuration example of a ripple canceller according to a comparative example.

FIG. 9 is a circuit diagram showing a configuration example of a ripple canceller according to a comparative example. This comparative example is a circuit described in Non-Patent Document 1. In this comparative example, with a resolution of M bits, M pieces of comparator units and M pieces of capacitor units are arranged in the ripple canceller. An nMOS transistor and a switch transistor of a differential pair are arranged in each of the comparator units, and four capacitors and six switches are arranged in each of the capacitor units. In addition, the capacitance and the size of the differential pair of the LSB are the largest, and the capacitance and the size are halved in the second bit and thereafter.

In the comparative example, the ripple component of the CDAC can be canceled by the control of the switch. However, four capacitors need to be arranged for every bit, and the circuit scale becomes larger as the resolution becomes higher.

In addition, in the comparative example, as the value of the capacitance in the capacitor unit increases, the on-resistance of the switch to which the capacitor is connected needs to be lowered. Therefore, in a case where the switch is realized by an nMOS transistor, the size of the transistor needs to be increased as the capacitance value increases. This nMOS transistor needs to be driven in conjunction with the CDAC 300, but the power consumption for driving possibly increases as the size of the nMOS transistor increases.

Moreover, in the comparative example, the higher the resolution, the more wiring lines connecting the capacitor unit and the comparator unit. In a case where the switch to which the common voltage VCOM of the capacitor unit is connected is in the open state, each wiring line has very high impedance. Therefore, there is a possibility of being affected by disturbance. In particular, as the capacitor unit and the differential pair are farther away from each other, the wiring line therebetween needs to be routed over a long distance, and the capacitor unit and the differential pair are easily affected by disturbance.

On the other hand, in the ripple canceller 500 exemplified in FIG. 6, the gates of M pairs of transistors (the positive-side transistor 539 and the negative-side transistor 540) having different sizes are commonly connected to the positive-side common capacitor 513 and the negative-side common capacitor 514. In this configuration, the number of capacitors required is only two regardless of the resolution, which allows the circuit scale to be reduced as compared with the comparative example.

Furthermore, in FIG. 6, by providing the switches 531 to 536 on the drain side of the transistor in the capacitor unit, the size of these switches can be made smaller than that of the comparative example. With this arrangement, power consumption for driving these switches can be reduced.

Moreover, in FIG. 6, the number of wiring lines required between the capacitor unit and the comparator unit is only three regardless of the resolution, which allows the influence of disturbance to be suppressed as compared with the comparative example.

[Operation Example of SARADC]

Figure 10:
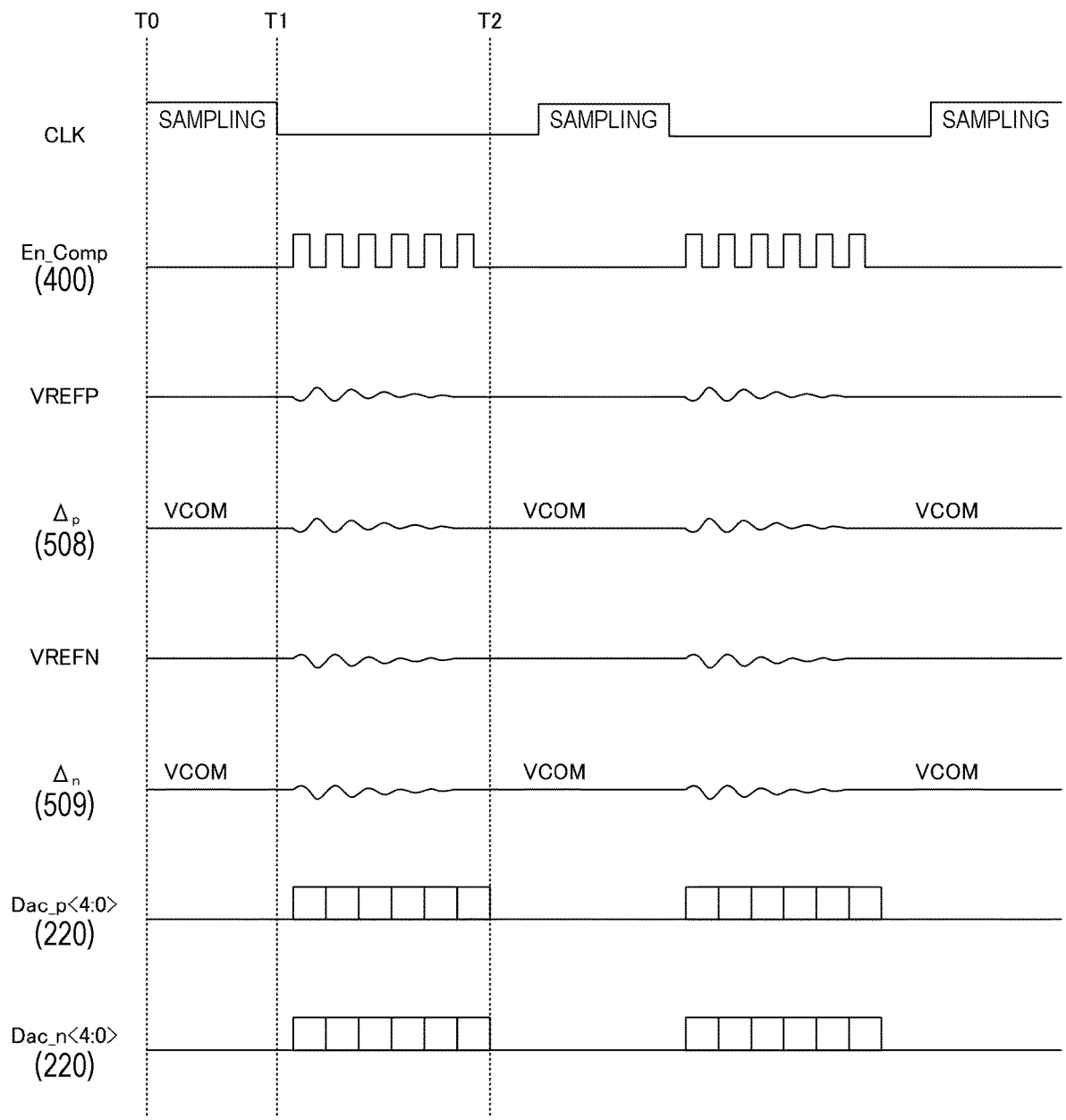
FIG. 10 is a timing chart showing an example of an operation of the SARADC according to the first embodiment of the present technology.

FIG. 10 is a timing chart showing an example of an operation of the SARADC 200 according to the first embodiment of the present technology. The sampling clock CLK turns to the high level over the sampling period from timings T0 to T1. During this period, the CDAC 300 captures and holds the sampled differential signal.

Within the period from the timing T1 to the timing T2, the differential amplifier circuit 420 in the comparator 400 performs M times of comparison in synchronization with the enable signal En_Comp. On the basis of these comparison results, the SAR logic circuit 220 updates the control signals Dac_p and Dac_n M times.

In accordance with the update of the control signals Dac_p and Dac_n, the CDAC 300 switches the connection destination of the capacitor to one of the positive-side reference voltage VREFP and the negative-side reference voltage VREFN. At this time, a ripple component is generated in the positive-side reference voltage VREFP and the negative-side reference voltage VREFN. On the other hand, components $\Delta_p$ and $\Delta_n$ are generated in the positive-side signal line 508 and the negative-side signal line 509 in the ripple canceller 500. These $\Delta_p$ and $\Delta_n$ remove the ripple component generated in the CDAC 300.

Figure 11:
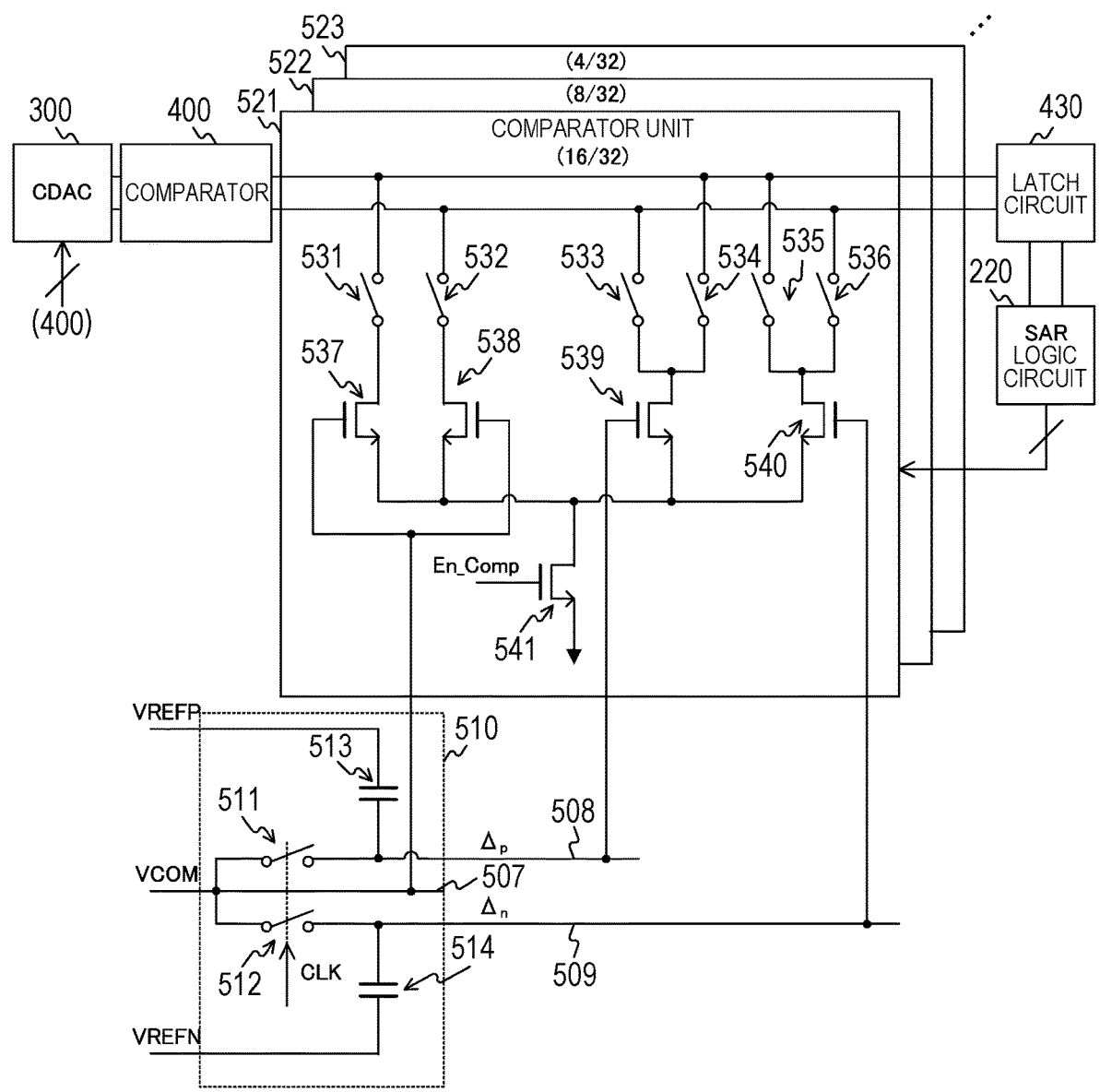
FIG. 11 is an example of an overall view of the SARADC according to the first embodiment of the present technology.

FIG. 11 is an example of an overall view of the SARADC 200 according to the first embodiment of the present technology. In a case where the differential signal is input to the SARADC 200, the CDAC 300 generates an analog differential signal on the basis of the control signal from the SAR logic circuit 220 and outputs the signal to the comparator 400. On the other hand, in a case where the single-ended signal is input to the SARADC 200, the CDAC 300 generates an analog single-ended signal and outputs the signal to the comparator 400. As described above, the CDAC 300 generates at least one of the pair of analog signals and outputs the generated signal to the comparator 400. Note that the CDAC 300 is an example of a digital-to-analog converter recited in the claims.

The comparator 400 compares the input differential signals and generates a comparison result. This latch circuit 430 holds the comparison result and supplies the comparison result to the SAR logic circuit 220. The SAR logic circuit 220 generates a control signal on the basis of the comparison result and supplies the control signal to the CDAC 300, the comparator unit 521, and the like. Note that the SAR logic circuit 220 is an example of a logic circuit recited in the claims.

In the ripple canceller 500, one end of the positive-side common capacitor 513 is connected to the node of the positive-side reference voltage VREFP, and one end of the negative-side common capacitor 514 is connected to the node of the negative-side reference voltage VREFN.

The sampling switches 511 and 512 respectively open and close paths between the corresponding one of the other ends of the positive-side common capacitor 513 and the negative-side common capacitor 514 and the node of the common voltage VCOM in synchronization with the sampling clock CLK.

Furthermore, the gates of the M pieces of the positive-side transistors 539 having different sizes are commonly connected to the positive-side common capacitor 513 via the positive-side signal line 508. The gates of the M pieces of the negative-side transistors 540 having different sizes are commonly connected to the negative-side common capacitor 514 via the negative-side signal line 509.

The gates of the M pairs of common-side transistors having different sizes are commonly connected to the node of the common voltage VCOM.

The switches 531 to 536 respectively open and close the path between the corresponding one of the drains of the transistor such as the common-side transistor and the output terminal of the comparator 400 on the basis of the control signal.

As described above, according to the first embodiment of the present technology, because M pieces of the comparator units are commonly connected to the positive-side common capacitor 513 and the negative-side common capacitor 514, the circuit scale can be reduced as compared with a case where a plurality of capacitors is arranged for every bit.

2. Second Embodiment

In the first embodiment described above, the sampling switches 511 and 512 in the ripple canceller 500 perform sampling within the sampling period. It is preferable that these sampling switches 511 and 512 perform sampling in a stable voltage state without the ripple. An SARADC 200 of a second embodiment is different from that of the first embodiment in that sampling switches 511 and 512 perform sampling within a period from the end of conversion to the start of sampling.

Figure 12:
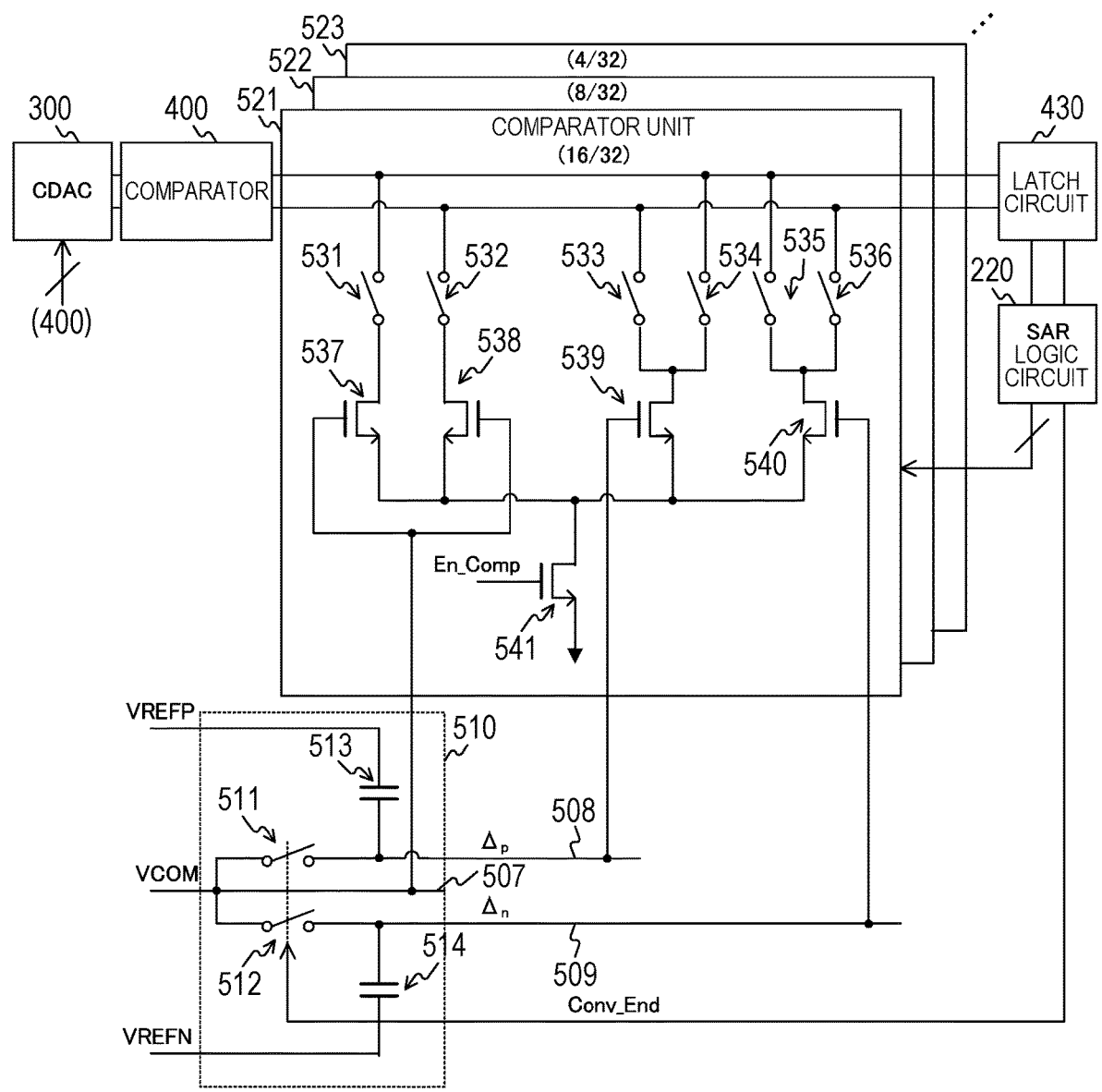
FIG. 12 is an example of an overall view of an SARADC according to a second embodiment of the present technology.

FIG. 12 is an example of an overall view of the SARADC 200 according to the second embodiment of the present technology. The SARADC 200 of the second embodiment is different from that of the first embodiment in that the sampling switches 511 and 512 are opened and closed according to a comparison end flag Conv_End from an SAR logic circuit 220.

The SAR logic circuit 220 of the second embodiment turns the sampling switches 511 and 512 to the closed state by the comparison end flag Conv_End within a period from the end of analog-to-digital (AD) conversion to the start of sampling.

Figure 13:
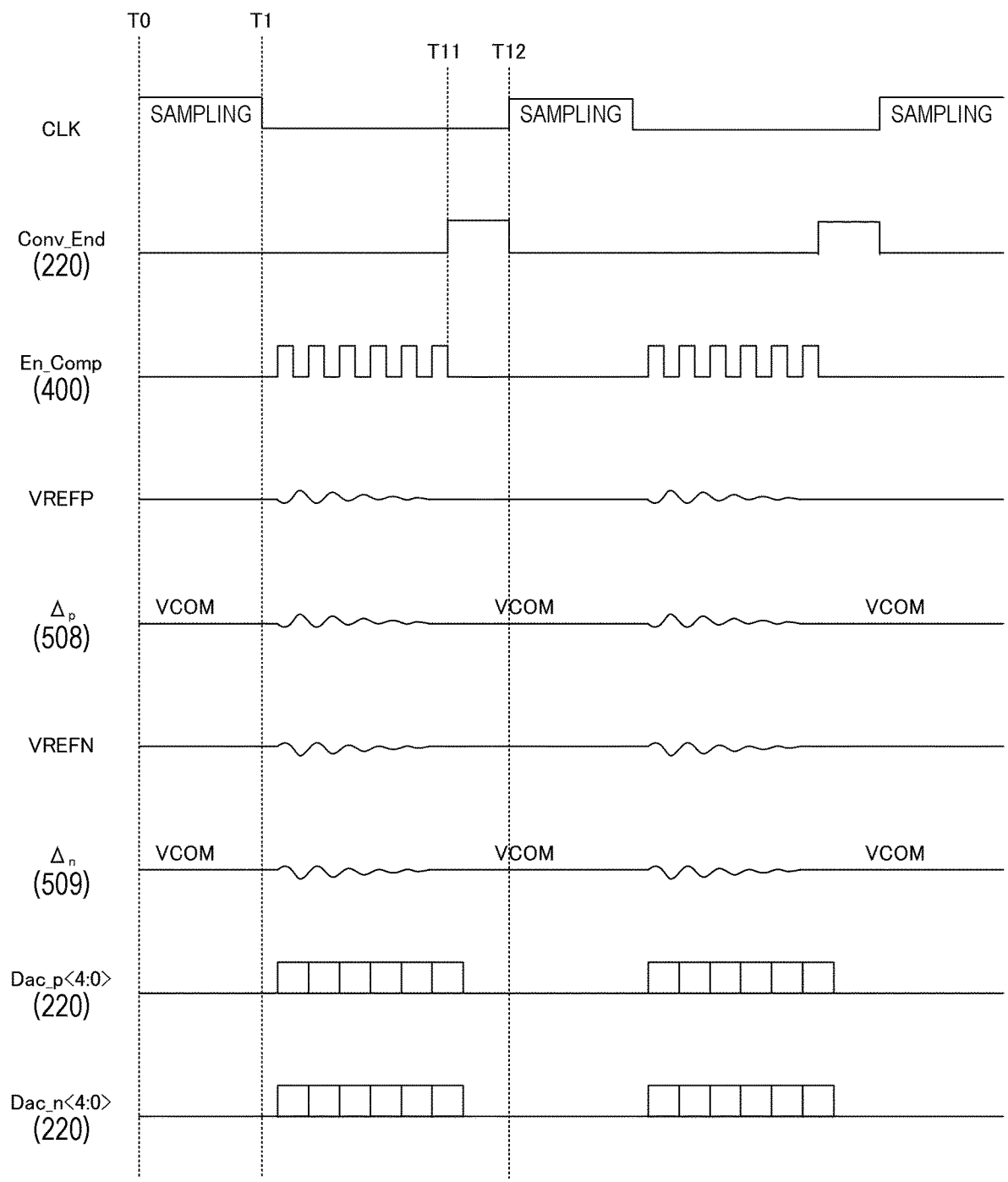
FIG. 13 is a timing chart showing an example of an operation of the SARADC according to the second embodiment of the present technology.

FIG. 13 is a timing chart showing an example of an operation of the SARADC 200 according to the second embodiment of the present technology. The SAR logic circuit 220 of the second embodiment supplies the comparison end flag Conv_End of the high level within a period from timing T11 at the end of the AD conversion to timing T12 at the start of the next sampling.

According to the comparison end flag Conv_End of the high level, the sampling switches 511 and 512 shift to the closed state and perform the sampling.

Depending on the SARADC 200, the voltage state may be more stable in the period from the end of AD conversion to the start of sampling than in the sampling period. In this case, the influence of the ripple can be reduced by performing the control shown in the drawing.

As described above, according to the second embodiment of the present technology, because the sampling switches 511 and 512 shift to the closed state within the period from the end of AD conversion to the start of sampling, the sampling can be performed when the voltage state is stable.

3. Third Embodiment

In the first embodiment described above, the differential pair of nMOS transistors is arranged in the differential amplifier circuit 420 and the ripple canceller 500, but a differential pair of pMOS transistors can be arranged instead. An SARADC 200 of a third embodiment is different from that of the first embodiment in that the differential pair of pMOS transistors are arranged instead of the differential pair of nMOS transistors.

Figure 14:
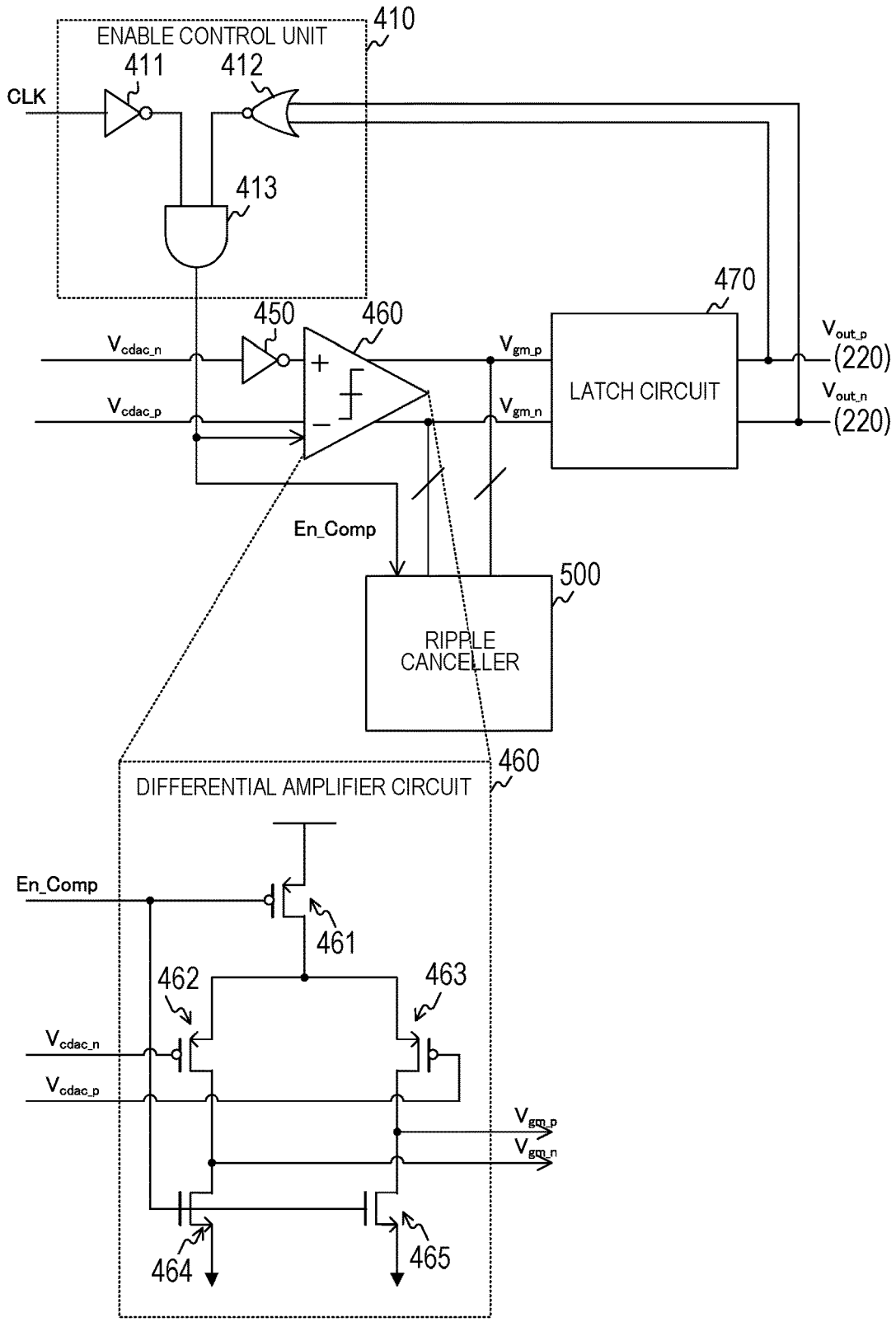
FIG. 14 is a circuit diagram showing a configuration example of a differential amplifier circuit according to a fourth embodiment of the present technology.

FIG. 14 is a circuit diagram showing a configuration example of a differential amplifier circuit 460 according to the third embodiment of the present technology. The differential amplifier circuit 460 of the third embodiment includes pMOS transistors 461 to 463 and nMOS transistors 464 and 465. The circuit configuration of the differential amplifier circuit 460 is similar to that of the differential amplifier circuit 420 exemplified in FIG. 4 except that the polarities of the respective transistors are opposite. In the fourth embodiment, the differential amplifier circuit 460 starts the comparison operation when an enable signal En_Comp changes from the high level to the low level. In addition, an inverter 450 is inserted on the precedent stage of a positive-side input terminal of the differential amplifier circuit 460.

Figure 15:
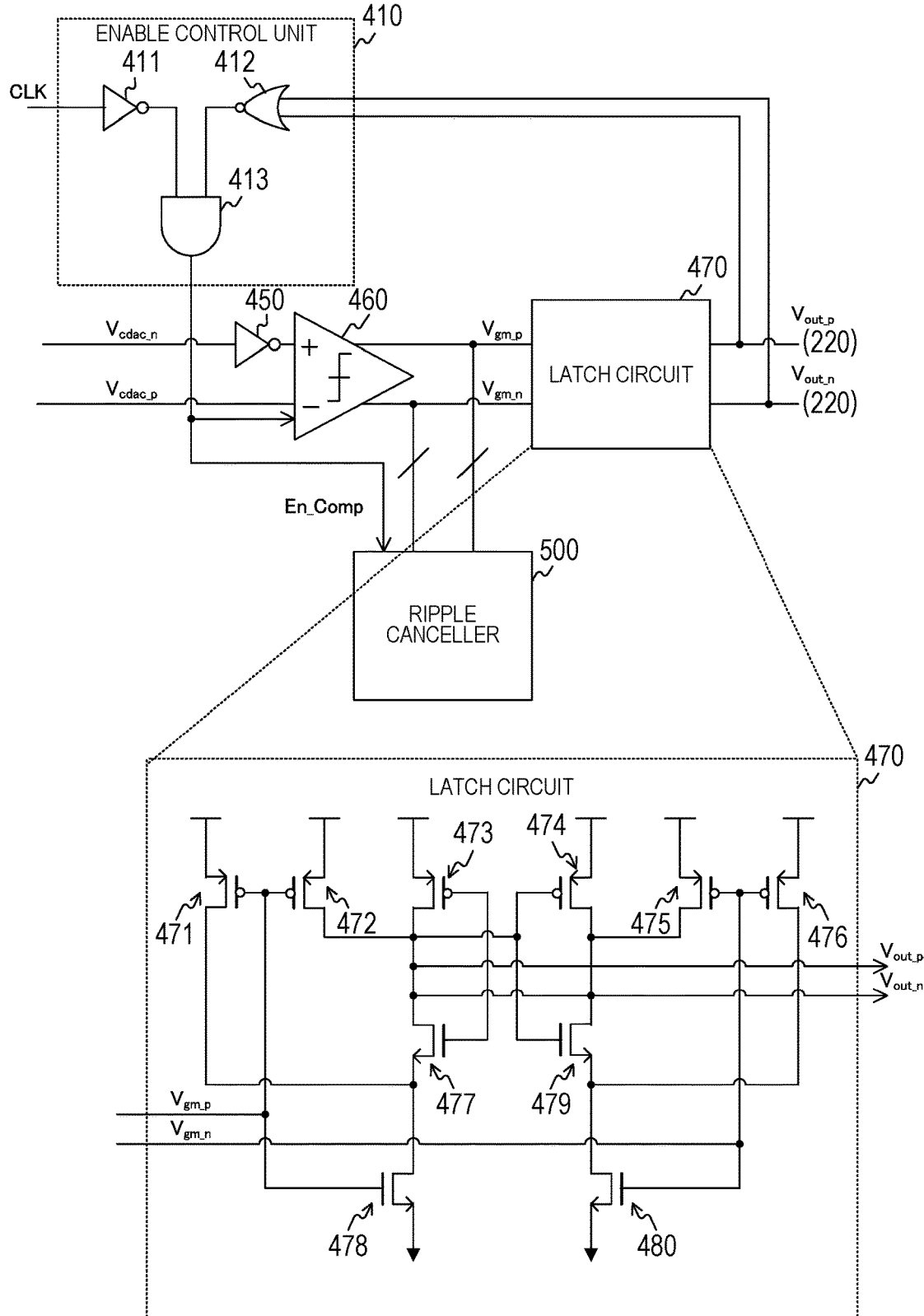
FIG. 15 is a circuit diagram showing a configuration example of a latch circuit according to the fourth embodiment of the present technology.

FIG. 15 is a circuit diagram showing a configuration example of a latch circuit 470 according to the third embodiment of the present technology. The latch circuit 470 of the third embodiment includes pMOS transistors 471 to 476 and nMOS transistors 477 to 480. The circuit configuration of the latch circuit 470 is similar to that of the latch circuit 430 exemplified in FIG. 13 except that the polarities of the respective transistors are opposite.

Figure 16:
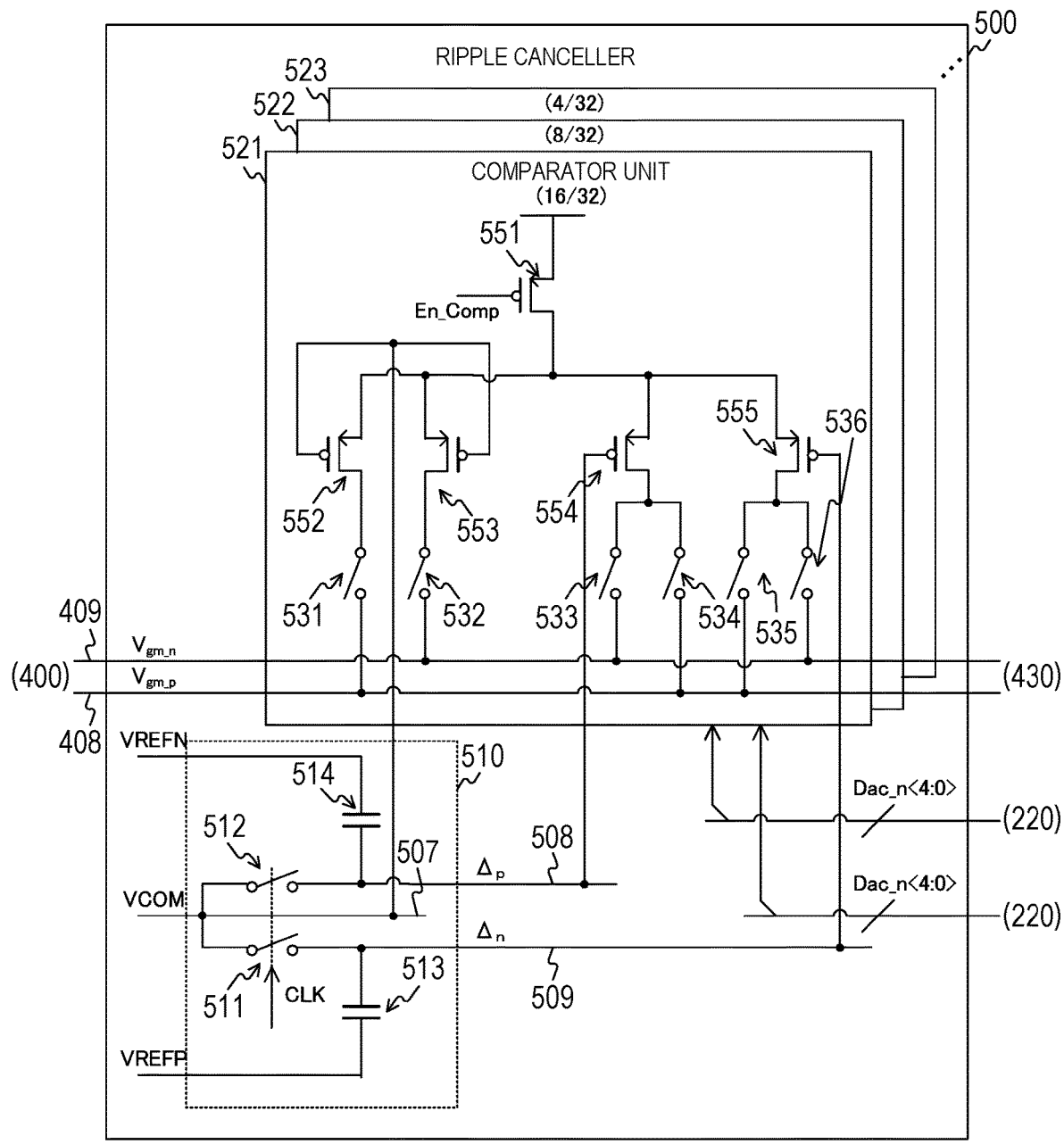
FIG. 16 is a circuit diagram showing a configuration example of a ripple canceller according to the fourth embodiment of the present technology.

FIG. 16 is a circuit diagram showing a configuration example of a ripple canceller 500 according to the third embodiment of the present technology. The ripple canceller 500 of the third embodiment includes, in a comparator unit 521, a switch transistor 551, common-side transistors 552 and 553, a positive-side transistor 554, a negative-side transistor 555, and switches 531 to 536. As these transistors, pMOS transistors are used. The similar applies to the comparator units for a comparator unit 522 and thereafter.

Note that the second embodiment can be applied to the third embodiment.

As described above, according to the third embodiment of the present technology, because the differential pair of the pMOS transistors is used instead of the differential pair of the nMOS transistors, a comparator 400 starts the comparison operation when the enable signal En_Comp changes from the high level to the low level.

4. Fourth Embodiment

In the first embodiment described above, in addition to the reference voltages (VREFP and VREFN), the common voltage VCOM is supplied to the ripple canceller 500. However, in this configuration, a circuit that generates a common voltage VCOM is required. In addition, in a case where the input common voltage of the SARADC 200 is different from VCOM, the ripple cancellation effect is possibly reduced. An SARADC 200 of a fourth embodiment is different from that of the first embodiment in that the common voltage VCOM does not need to be supplied to a ripple canceller 500.

Figure 17:
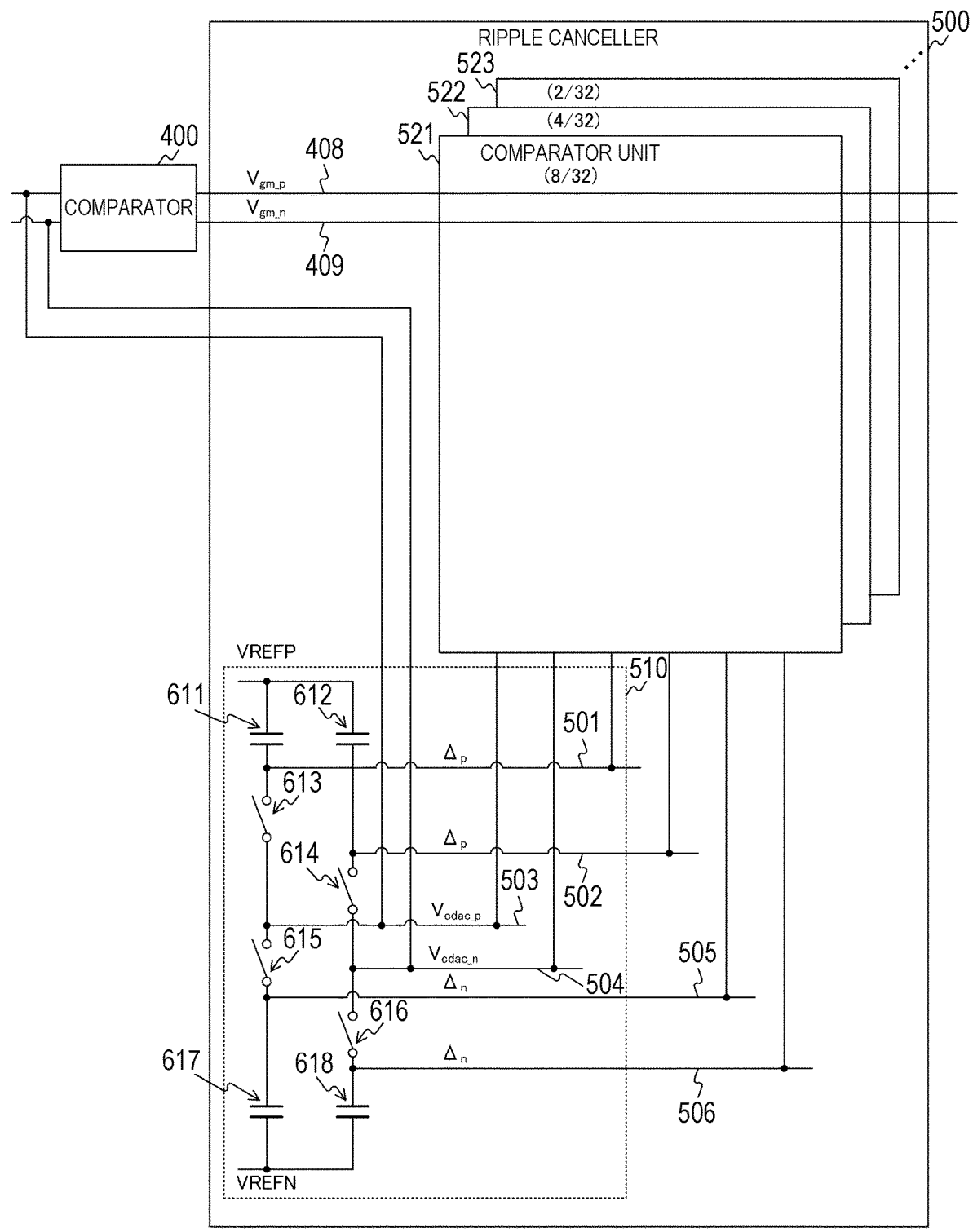
FIG. 17 is a circuit diagram showing a configuration example of a ripple canceller according to a fifth embodiment of the present technology.

FIG. 17 is a circuit diagram showing a configuration example of the ripple canceller 500 according to the fourth embodiment of the present technology. The ripple canceller 500 of the fourth embodiment includes, in a capacitor unit 510, positive-side common capacitors 611 and 612, sampling switches 613 to 616, and negative-side common capacitors 617 and 618.

One ends of the positive-side common capacitors 611 and 612 are commonly connected to a node of a positive-side reference voltage VREFP. The capacitance value of each of the positive-side common capacitors 611 and 612 is set to half of the positive-side common capacitor 513 of the first embodiment. Note that the positive-side common capacitors 611 and 612 are examples of a first positive-side common capacitor and a second positive-side common capacitor recited in the claims.

The sampling switch 613 opens and closes a path between the other end of the positive-side common capacitor 611 and the sampling switch 615 in synchronization with a sampling clock CLK. The sampling switch 614 opens and closes a path between the other end of the positive-side common capacitor 612 and the sampling switch 616 in synchronization with the sampling clock CLK.

One ends of the negative-side common capacitors 617 and 618 are commonly connected to a node of a negative-side reference voltage VREFN. The capacitance value of each of the negative-side common capacitors 617 and 618 is set to half of the negative-side common capacitor 514 of the first embodiment. Note that the negative-side common capacitors 617 and 618 are examples of a first negative-side common capacitor and a second negative-side common capacitor recited in the claims.

The sampling switch 615 opens and closes a path between the other end of the negative-side common capacitor 617 and the sampling switch 613 in synchronization with the sampling clock CLK. The sampling switch 616 opens and closes a path between the other end of the negative-side common capacitor 618 and the sampling switch 614 in synchronization with the sampling clock CLK.

Furthermore, a connection node between the positive-side common capacitor 611 and the sampling switch 613 is connected to a positive-side signal line 501, and a connection node between the positive-side common capacitor 612 and the sampling switch 614 is connected to a positive-side signal line 502.

Furthermore, a connection node between the sampling switches 613 and 615 is connected to a common signal line 503, and a connection node between the sampling switches 614 and 616 is connected to a common signal line 504. The common signal line 503 is connected to a positive-side input terminal (that is, a positive-side output terminal of a CDAC 300) of a comparator 400, and is supplied with $V_{cdac\_p}$. The common signal line 504 is connected to a negative-side input terminal (that is, a negative-side output terminal of the CDAC 300) of the comparator 400, and is supplied with $V_{cdac\_n}$.

Furthermore, a connection node between the negative-side common capacitor 617 and the sampling switch 615 is connected to a negative-side signal line 505, and a connection node between the negative-side common capacitor 618 and the sampling switch 616 is connected to a negative-side signal line 506.

Figure 18:
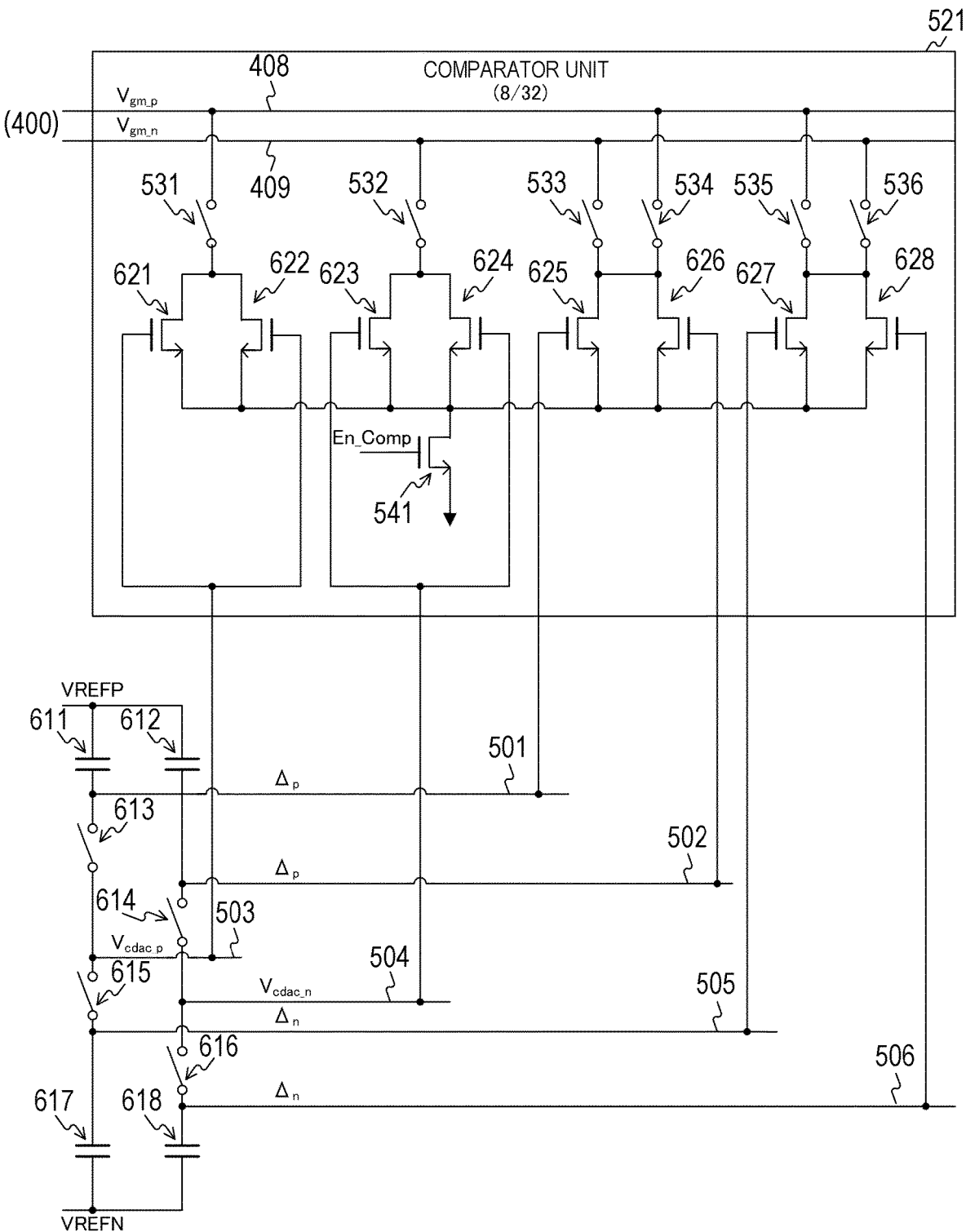
FIG. 18 is a circuit diagram showing a configuration example of a comparator unit according to the fifth embodiment of the present technology.

FIG. 18 is a circuit diagram showing a configuration example of a comparator unit 521 according to the fourth embodiment of the present technology. In the comparator unit 521 of the fourth embodiment, common-side transistors 621 to 624 are arranged instead of the common-side transistors 537 and 538. In addition, positive-side transistors 625 and 626 are arranged instead of the positive-side transistor 539, and negative-side transistors 627 and 628 are arranged instead of the negative-side transistor 540. The size of each of the transistors of the fifth embodiment is set to a half of that of the first embodiment. The sizes of the transistors of the comparator units 521, 522, 523, 524, and 525 are respectively set to "8", "4", "2", "1", and "½".

In addition, the drains of the common-side transistors 621 and 622 are connected to a switch 531, and the gates thereof are connected to the common signal line 503. The drains of the common-side transistors 623 and 624 are connected to a switch 532, and the gates thereof are connected to the common signal line 504.

Note that the common-side transistors 621 and 622 are examples of a first common-side transistor recited in the claims, and the common-side transistors 623 and 624 are examples of a second common-side transistor recited in the claims.

The drains of the positive-side transistors 625 and 626 are connected to both of switches 533 and 534. The gate of the positive-side transistor 625 is connected to the positive-side signal line 501, and the gate of the positive-side transistor 626 is connected to the positive-side signal line 502. Note that the positive-side transistors 625 and 626 are examples of a first positive-side transistor and a second positive-side transistor recited in the claims.

The drains of the negative-side transistors 627 and 628 are connected to both of switches 535 and 536. The gate of the negative-side transistor 627 is connected to the negative-side signal line 505, and the gate of the negative-side transistor 628 is connected to the negative-side signal line 506. Note that the negative-side transistors 627 and 628 are examples of a first negative-side transistor and a second negative-side transistor recited in the claims.

In a case where the switches 531 and 532 on the common side are in the closed state, the four transistors on the common side perform the discharging operation. Assuming that a transconductance of a transistor having a size of 8/32 (=¼) is ¼×$g_m$, a current $I_c$ flowing through the switches 531 and 532 is expressed by the following equation.

$$I_c = (g_m/4) \times (V_{cdac\_p} + V_{cdac\_n}) = (g_m/2) \times (V_{cdac\_com}) \quad \text{Equation 3}$$

Here, $V_{cdac\_com}$ is equal to the common voltage of $V_{cdac\_p}$ and $V_{cdac\_n}$ which are the differential signals. If $V_{cdac\_com}$=VCOM, $I_c$ is equal to the current that the common-side transistors 537 and 538 of the first embodiment cause to flow therethrough. As described above, even in a case where there is no common voltage VCOM, a current equivalent to that in the first embodiment can flow, and a desired circuit operation can be realized.

On the other hand, also in a case where one of the switches 533 and 534 and one of the switches 535 and 536 are in the closed state, the transistors of these connection destinations perform the discharge operation at the timing of the comparison operation. At this time, the current flowing through the switch on the drain side is expressed by the following equation.

$$I_p = \quad \text{Equation 4}$$
$$(g_m/4) \times (V_{cdac\_p} + V_{cdac\_n} + 2 \times \Delta p) = (g_m/2) \times (V_{cdac\_com} + \Delta_p)$$
$$I_n = \quad \text{Equation 5}$$
$$(g_m/4) \times (V_{cdac\_p} + V_{cdac\_n} + 2 \times \Delta_n) = (g_m/2) \times (V_{cdac\_com} + \Delta_n)$$

$\Delta_p$ and $\Delta_n$ in Equations 4 and 5 are ripple components generated in the positive-side reference voltage VREFP and the negative-side reference voltage VREFN, respectively. If $V_{cdac\_com}$=VCOM, currents $I_c$ and $I_n$ are equal to the current that the positive-side transistor and the negative-side transistor of the first embodiment cause to flow therethrough. As described above, even in a case where there is no common voltage VCOM, a current equivalent to that in the first embodiment can flow, and a desired circuit operation can be realized.

Note that the second and third embodiments can be applied to the fourth embodiment.

As described above, according to the fourth embodiment of the present technology, because the current equivalent to that of the first embodiment is generated by dividing each of the transistors into two, each of whose size is halved, and by dividing each of the capacitors into two, each of whose capacitance value is halved, the common voltage VCOM becomes unnecessary.

5. Application Example to Mobile Body

The technology according to the present disclosure (present technology) can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

Figure 19:
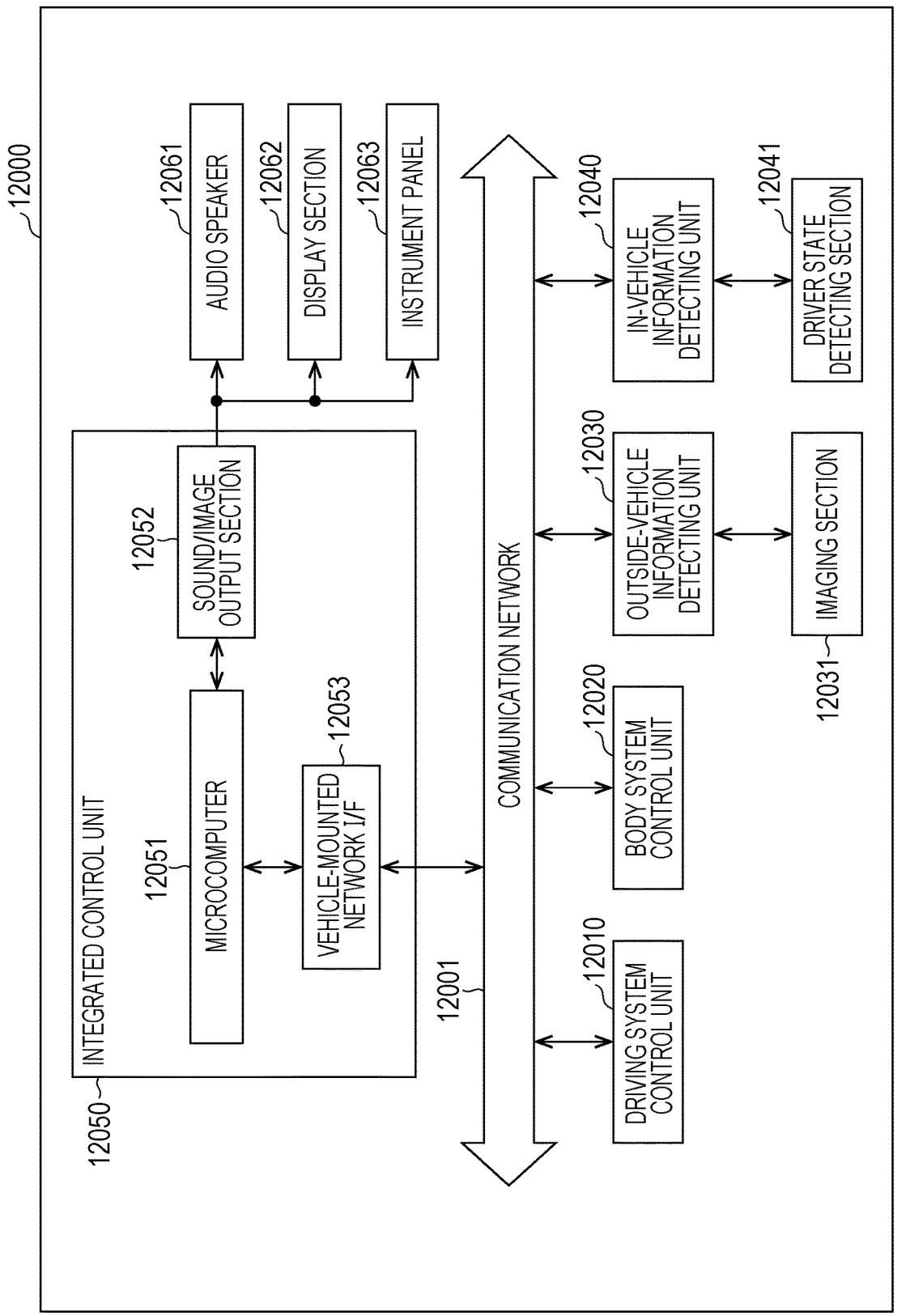
FIG. 19 is a block diagram showing a schematic configuration example of a vehicle control system.

FIG. 19 is a block diagram showing an example of schematic configuration of a vehicle control system as an example of a mobile body control system to which the technology according to the technology of the present disclosure can be applied.

The vehicle control system 12000 includes a plurality of electronic control units connected to each other via a communication network 12001. In the example shown in FIG. 19, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle, the information being obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example in FIG. 19, an audio speaker 12061, a display section 12062, and an instrument panel 12063 are exemplified as the output device. The display section 12062 may, for example, include at least one of an on-board display and a head-up display.

Figure 20:
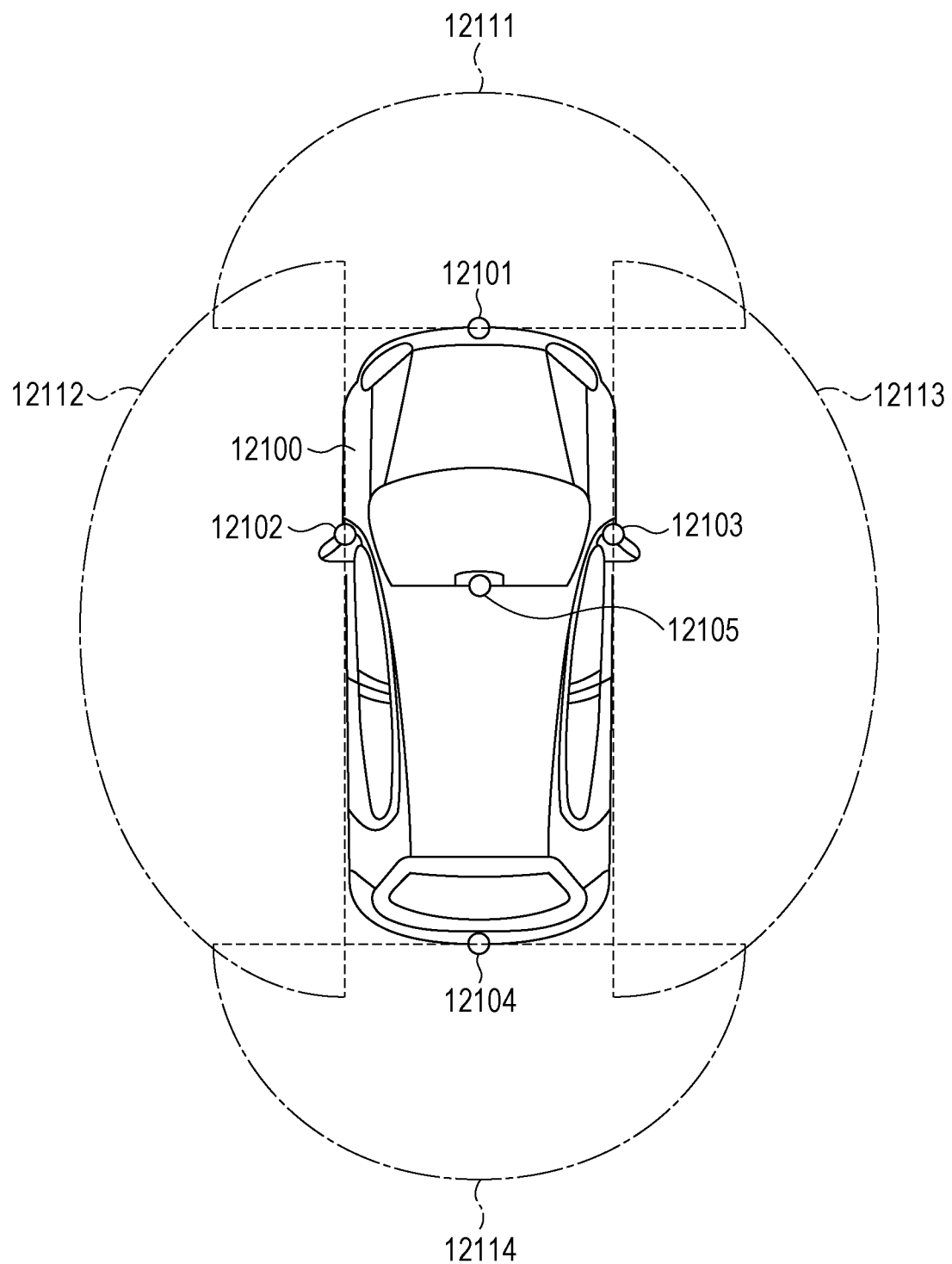
FIG. 20 is an explanatory diagram showing an example of an installation position of an imaging section.

FIG. 20 is a diagram showing an example of an installation position of the imaging section 12031.

In FIG. 20, the imaging section 12031 includes imaging sections 12101, 12102, 12103, 12104, and 12105.

The imaging sections 12101, 12102, 12103, 12104, and 12105 are, for example, disposed at positions of the vehicle 12100 such as a front nose, sideview mirrors, a rear bumper, a back door, and an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 20 shows an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied, for example, to the imaging section 12031 among the configurations described above. Specifically, the electronic apparatus 100 in FIG. 1 can be applied to the imaging section 12031. By applying the technology according to the present disclosure to the imaging section 12031, the circuit scale can be reduced.

Note that the embodiments described above show an example for embodying the present technology, and matters in the embodiments and matters specifying the invention in the claims have respective correspondence relationships. Similarly, the matters specifying the invention in the claims and matters having the same names in the embodiments of the present technology have respective correspondence relationships.

However, the present technology is not limited to the embodiments and can be embodied by making various modifications to the embodiments without departing from the gist thereof.

Note that the effects described in the present description are merely exemplifications and are not limited, and furthermore, other effects may be provided.

Note that the present technology can also take the following configurations.

(1) An analog-to-digital converter including:
a digital-to-analog converter that generates at least one of a pair of analog signals according to a predetermined control signal;
a comparator that compares the pair of analog signals and outputs a comparison result;
a logic circuit that generates the control signal on the basis of the comparison result;
a plurality of positive-side transistors having different sizes;
a plurality of negative-side transistors having different sizes;
a plurality of switches each opens and closes a path between one of a source and a drain of each of the plurality of positive-side transistors and the plurality of negative-side transistors and an output terminal of the comparator on the basis of the control signal;
a positive-side common capacitor whose one end is connected to a node of a predetermined positive-side reference voltage and an other end is connected in common to each of gates of the plurality of positive-side transistors; and
a negative-side common capacitor whose one end is connected to a node of a negative-side reference voltage lower than the positive-side reference voltage and an other end is connected in common to gates of each of the plurality of negative-side transistors.
(2) The analog-to-digital converter according to (1) described above,
in which the pair of analog signals includes a differential signal, and the digital-to-analog converter generates the differential signal.
(3) The analog-to-digital converter according to (1) and (2) described above, further including a sampling switch that opens and closes a path between the other end of each of the positive-side common capacitor and the negative-side common capacitor and a common voltage between the positive-side reference voltage and the negative-side reference voltage.
(4) The analog-to-digital converter according to (3) described above,
in which the sampling switch shifts to a closed state within a predetermined sampling period.
(5) The analog-to-digital converter according to (3) described above,
in which the sampling switch shifts to a closed state within a period from an end of analog-to-digital conversion to a start of sampling.
(6) The analog-to-digital converter according to any one of (1) to (5) described above, further including a latch circuit that holds the comparison result and supplies the comparison result to the logic circuit.
(7) The analog-to-digital converter according to any one of (1) to (6), in which each of the plurality of positive-side transistors and the plurality of negative-side transistors includes an nMOS transistor.
(8) The analog-to-digital converter according to any one of (1) to (6), in which each of the plurality of positive-side transistors and the plurality of negative-side transistors includes a pMOS transistor.
(9) The analog-to-digital converter according to any one of (1) to (8), further including a plurality of pairs of common-side transistors having different sizes,
in which the plurality of pairs of common-side transistors each has a gate connected to a node of a common voltage between the positive-side reference voltage and the negative-side reference voltage.
(10) The analog-to-digital converter according to any one of (1) to (8), further including:
a plurality of pairs of first common-side transistors having different sizes; and
a plurality of pairs of second common-side transistors having different sizes, in which
the positive-side common capacitor includes a first positive-side common capacitor and a second positive-side common capacitor,
the negative-side common capacitor includes a first negative-side common capacitor and a second negative-side common capacitor,
the plurality of positive-side transistors includes:
a plurality of first positive-side transistors having different sizes; and
a plurality of second positive-side transistors having different sizes,
the plurality of negative-side transistors includes:
a plurality of first negative-side transistors having different sizes; and
a plurality of second negative-side transistors having different sizes,
the plurality of first positive-side transistors each has a gate connected in common to the first positive-side common capacitor, the plurality of second positive-side transistors each has a
   gate connected in common to the second positive-side
   common capacitor,
the plurality of first negative-side transistors each has a
   gate connected in common to the first negative-side
   common capacitor, and
the plurality of second negative-side transistors each has
   a gate connected in common to the second negative-
   side common capacitor.
(11) An electronic apparatus including:
a digital-to-analog converter that generates at least one of
   a pair of analog signals according to a predetermined
   control signal;
a comparator that compares the pair of analog signals and
   outputs a comparison result;
a logic circuit that generates the control signal on the basis
   of the comparison result and also generates a digital
   signal;
a plurality of positive-side transistors having different
   sizes;
a plurality of negative-side transistors having different
   sizes;
a plurality of switches each opens and closes a path
   between one of a source and a drain of each of the
   plurality of positive-side transistors and the plurality of
   negative-side transistors and an output terminal of the
   comparator on the basis of the control signal;
a positive-side common capacitor whose one end is
   connected to a node of a predetermined positive-side
   reference voltage and an other end is connected in
   common to each of gates of the plurality of positive-
   side transistors;
a negative-side common capacitor whose one end is
   connected to a node of a negative-side reference volt-
   age lower than the positive-side reference voltage and
   an other end is connected in common to gates of each
   of the plurality of negative-side transistors; and
a digital signal processing circuit that processes the digital
   signal.

REFERENCE SIGNS LIST

100 Electronic apparatus
110 Analog signal generation unit
120 Digital signal processing unit
200 SARADC
211, 212, 511, 512, 613 to 616 Sampling switch
220 SAR logic circuit
300 CDAC
311 to 316 Positive-side capacitor
317 to 322 Negative-side capacitor
330 Positive-side switching unit
331 to 336 Positive-side switching circuit
340 Negative-side switching unit
341 to 346 Negative-side switching circuit
351 to 353, 531 to 536 Switch
400 Comparator
410 Enable control unit
411 Inverter
412 Negative logical sum (NOR) gate
413 AND (logical product) gate
420, 460 Differential amplifier circuit
421, 422, 431 to 434, 461 to 463, 471 to 476 pMOS
   transistor
423 to 425, 435 to 440, 464, 465, 477 to 480 nMOS
   transistor
430, 470 Latch circuit
500 Ripple canceller
510 Capacitor unit
513, 611, 612 Positive-side common capacitor
514, 617, 618 Negative-side common capacitor
521 to 525 Comparator unit
537, 538, 552, 553, 621 to 624 Common-side transistor
539, 554, 625, 626 Positive-side transistor
540, 555, 627, 628 Negative-side transistor
541, 551 Switch transistor
12031 Imaging section

The invention claimed is:

1. An analog-to-digital converter comprising:
   a digital-to-analog converter that generates at least one of
      a pair of analog signals according to a predetermined
      control signal;
   a comparator that compares the pair of analog signals and
      outputs a comparison result;
   a logic circuit that generates the control signal on a basis
      of the comparison result;
   a plurality of positive-side transistors having different
      sizes;
   a plurality of negative-side transistors having different
      sizes;
   a plurality of switches each opens and closes a path
      between one of a source and a drain of each of the
      plurality of positive-side transistors and the plurality of
      negative-side transistors and an output terminal of the
      comparator on a basis of the control signal;
   a positive-side common capacitor whose one end is
      connected to a node of a predetermined positive-side
      reference voltage and an other end is connected in
      common to each of gates of the plurality of positive-
      side transistors; and
   a negative-side common capacitor whose one end is
      connected to a node of a negative-side reference volt-
      age lower than the positive-side reference voltage and
      an other end is connected in common to gates of each
      of the plurality of negative-side transistors.

2. The analog-to-digital converter according to claim 1, wherein
   the pair of analog signals includes a differential signal, and
   the digital-to-analog converter generates the differential signal.

3. The analog-to-digital converter according to claim 1, further comprising a sampling switch that opens and closes a path between the other end of each of the positive-side common capacitor and the negative-side common capacitor and a common voltage between the positive-side reference voltage and the negative-side reference voltage.

4. The analog-to-digital converter according to claim 3, wherein
   the sampling switch shifts to a closed state within a predetermined sampling period.

5. The analog-to-digital converter according to claim 3, wherein
   the sampling switch shifts to a closed state within a period from an end of analog-to-digital conversion to a start of sampling.

6. The analog-to-digital converter according to claim 1, further comprising a latch circuit that holds the comparison result and supplies the comparison result to the logic circuit.

7. The analog-to-digital converter according to claim 1, wherein
   each of the plurality of positive-side transistors and the plurality of negative-side transistors includes an nMOS transistor.

8. The analog-to-digital converter according to claim 1, wherein
each of the plurality of positive-side transistors and the plurality of negative-side transistors includes a pMOS transistor.

9. The analog-to-digital converter according to claim 1, further comprising a plurality of pairs of common-side transistors having different sizes, wherein
the plurality of pairs of common-side transistors each has a gate connected to a node of a common voltage between the positive-side reference voltage and the negative-side reference voltage.

10. The analog-to-digital converter according to claim 1, further comprising:
a plurality of pairs of first common-side transistors having different sizes; and
a plurality of pairs of second common-side transistors having different sizes, wherein
the positive-side common capacitor includes a first positive-side common capacitor and a second positive-side common capacitor,
the negative-side common capacitor includes a first negative-side common capacitor and a second negative-side common capacitor,
the plurality of positive-side transistors includes:
a plurality of first positive-side transistors having different sizes; and
a plurality of second positive-side transistors having different sizes,
the plurality of negative-side transistors includes:
a plurality of first negative-side transistors having different sizes; and
a plurality of second negative-side transistors having different sizes,
the plurality of first positive-side transistors each has a gate connected in common to the first positive-side common capacitor,
the plurality of second positive-side transistors each has a gate connected in common to the second positive-side common capacitor,
the plurality of first negative-side transistors each has a gate connected in common to the first negative-side common capacitor, and
the plurality of second negative-side transistors each has a gate connected in common to the second negative-side common capacitor.

11. An electronic apparatus comprising:
a digital-to-analog converter that generates at least one of a pair of analog signals according to a predetermined control signal;
a comparator that compares the pair of analog signals and outputs a comparison result;
a logic circuit that generates the control signal on a basis of the comparison result and also generates a digital signal;
a plurality of positive-side transistors having different sizes;
a plurality of negative-side transistors having different sizes;
a plurality of switches each opens and closes a path between one of a source and a drain of each of the plurality of positive-side transistors and the plurality of negative-side transistors and an output terminal of the comparator on a basis of the control signal;
a positive-side common capacitor whose one end is connected to a node of a predetermined positive-side reference voltage and an other end is connected in common to each of gates of the plurality of positive-side transistors;
a negative-side common capacitor whose one end is connected to a node of a negative-side reference voltage lower than the positive-side reference voltage and an other end is connected in common to gates of each of the plurality of negative-side transistors; and
a digital signal processing circuit that processes the digital signal.

* * * * *